United States Patent [19]
Koga

[11] Patent Number: 5,936,265
[45] Date of Patent: Aug. 10, 1999

[54] SEMICONDUCTOR DEVICE INCLUDING A TUNNEL EFFECT ELEMENT

[75] Inventor: Junji Koga, Yokohama, Japan

[73] Assignee: Kabushiki Kaisha Toshiba, Kawasaki, Japan

[21] Appl. No.: 08/805,847

[22] Filed: Mar. 3, 1997

[30] Foreign Application Priority Data

Mar. 25, 1996 [JP] Japan .................................. 8-067628
Sep. 18, 1996 [JP] Japan .................................. 8-246697

[51] Int. Cl.$^6$ ................................................ H01L 29/861
[52] U.S. Cl. .......................... 257/105; 257/104; 257/497
[58] Field of Search .................................. 257/104, 105, 257/379, 497, 401

[56] References Cited

U.S. PATENT DOCUMENTS

| | | | |
|---|---|---|---|
| 4,242,595 | 12/1980 | Lehovec | 307/205 |
| 4,876,580 | 10/1989 | Nishizawa | 357/22 |
| 5,032,891 | 7/1991 | Takagi et al. | |
| 5,278,436 | 1/1994 | Asahina et al. | 257/205 |
| 5,315,143 | 5/1994 | Tsuji | 257/351 |
| 5,389,810 | 2/1995 | Agata et al. | 257/369 |
| 5,583,362 | 12/1996 | Maegawa | 257/347 |
| 5,652,458 | 7/1997 | Ahn | 257/409 |
| 5,686,739 | 11/1997 | Baba | 257/105 |

FOREIGN PATENT DOCUMENTS

| | | | |
|---|---|---|---|
| 358159372 | 9/1983 | Japan | 257/105 |
| 6-334175 | 12/1994 | Japan . | |

*Primary Examiner*—Valencia Martin-Wallace
*Assistant Examiner*—George C. Eckert, II
*Attorney, Agent, or Firm*—Oblon, Spivak, McClelland, Maier & Neustadt, P.C.

[57] ABSTRACT

A semiconductor device includes a semiconductor substrate having an element region on the main surface thereof, an element isolation region formed to surround the element region on the main surface of the semiconductor substrate, a gate electrode formed over the element region with a gate insulating film disposed therebetween, a first and a second impurity diffusion region formed on a surface of the element region on both sides of at least part of the gate electrode, a first channel region formed in the surface of the element region below the gate electrode between the first and the second impurity diffusion region when a first preset voltage is applied to the gate electrode, and a first tunnel diode formed in a first interface region between the first impurity diffusion region and the first channel region when the first preset voltage is applied to the gate electrode, wherein the first interface region in which the first tunnel diode is formed is formed in position separated from the element isolation region.

30 Claims, 22 Drawing Sheets

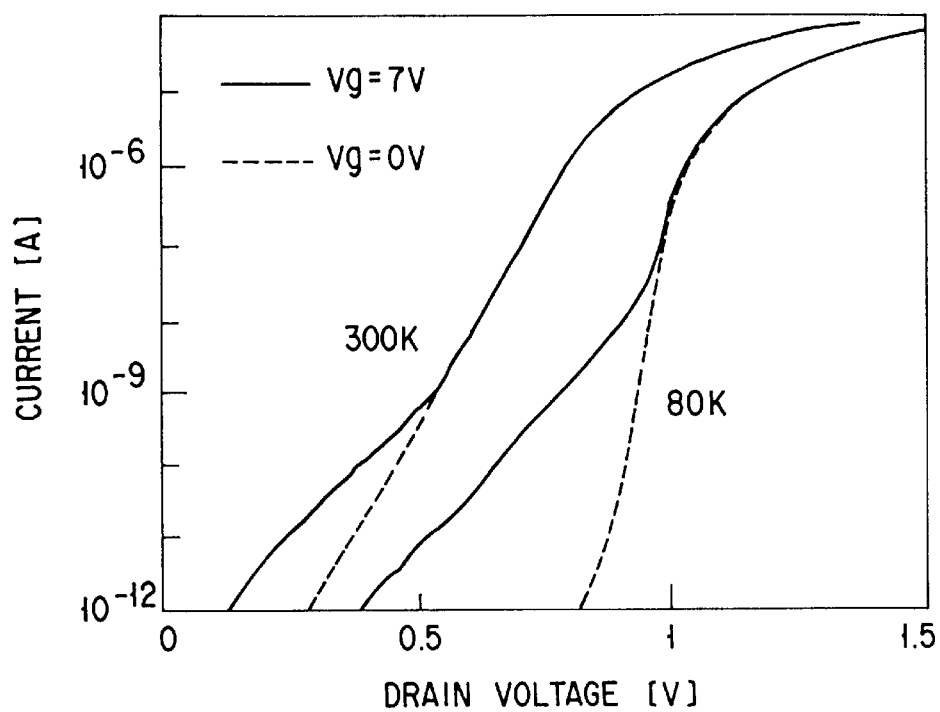
F I G. 5
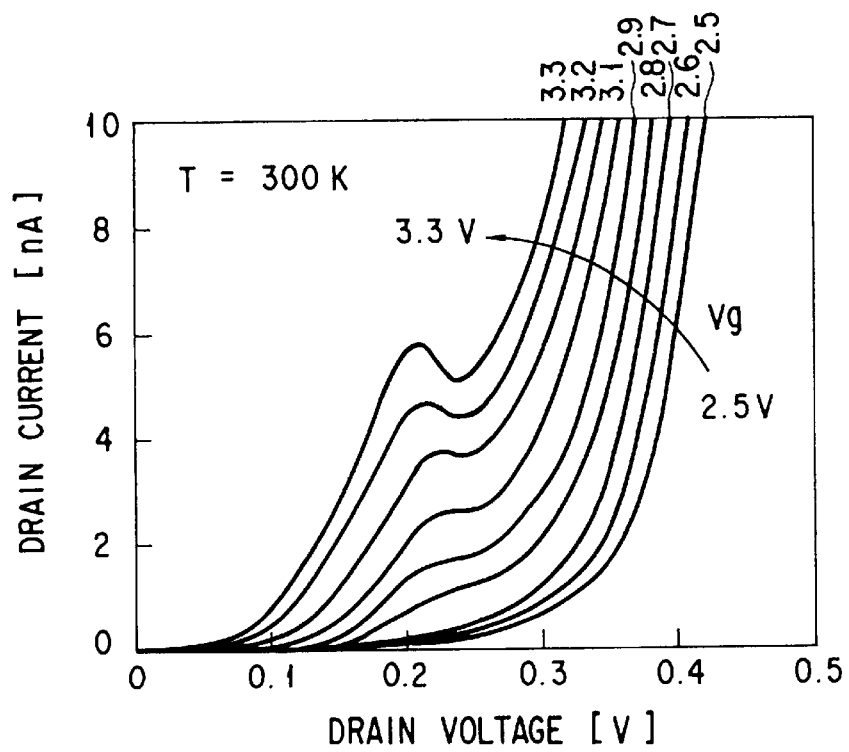
F I G. 7

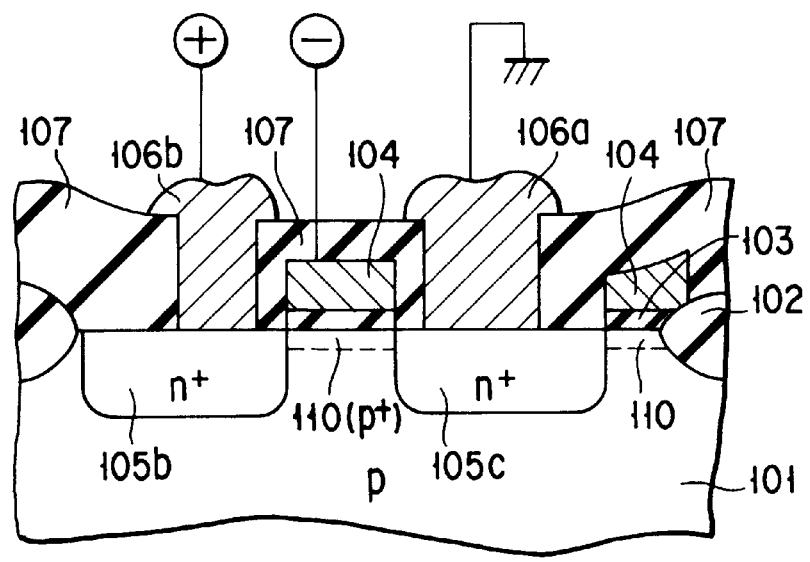
F I G. 8
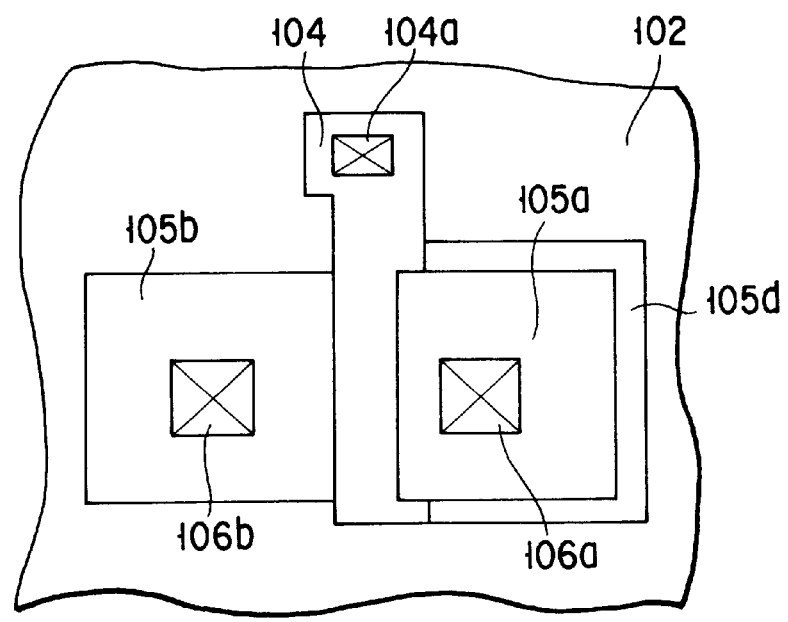
F I G. 9

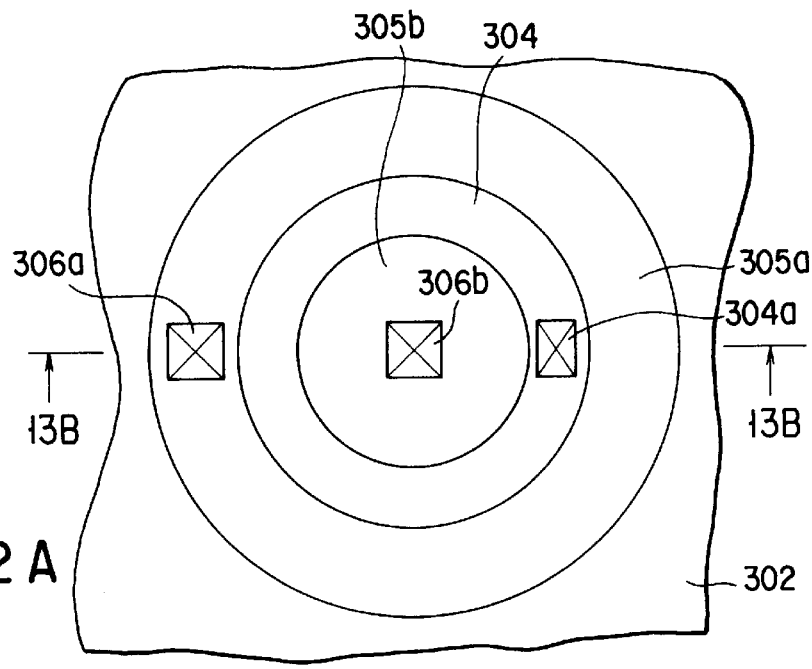
F I G. 12A
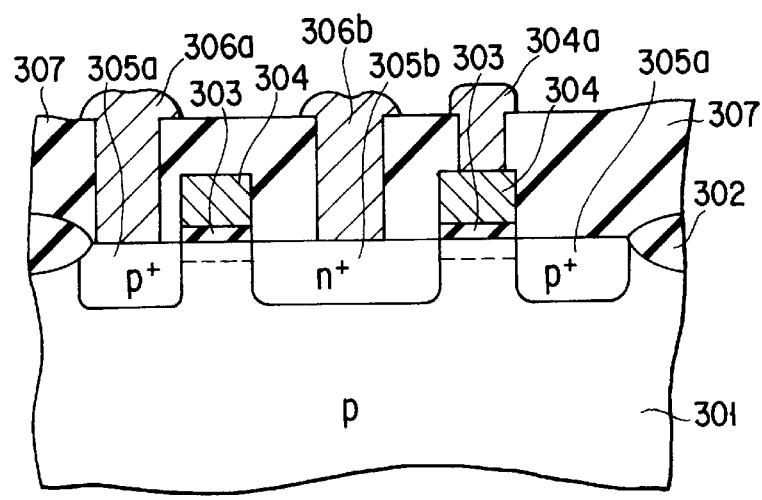
F I G. 12B

SEMICONDUCTOR DEVICE INCLUDING A TUNNEL EFFECT ELEMENT

BACKGROUND OF THE INVENTION

This invention relates to a semiconductor device, and more particularly to a semiconductor device using a tunnel effect element.

The size of MOSFETs is reduced based on the scaling rule in order to enhance the operation speed. However, in a submicron region, the scaling rule cannot be successfully applied. Particularly, in a region of 0.1 μm or less, there occurs a problem that a desired switching operation of a transistor cannot be attained because of the short channel effect.

In order to cope with the above problem, an element which can maintain the transistor operation even when the channel length is reduced is proposed (W Hönlein et al., "Influence of the MOS surface channel on a channel-to-contact diode characteristics", INFOS'79, Inst. Phys. Conf. Ser. No.50, Chapter 2, p. 133 1980). The element is obtained by applying a tunnel diode to the MOS structure and is referred to as a surface tunnel effect element with gate electrode in this specification.

The structure of the tunnel effect element is obtained by setting the conductivity types of the source diffusion layer and drain diffusion layer of a normal MOS transistor opposite to each other and enhance the impurity concentrations of the respective diffusion layers. For example, in this element, a gate insulating film of silicon oxide film is formed on the surface of a p-type silicon substrate and a gate electrode of Al or the like is formed on the gate insulating film (MOS structure). Then, an $n^+$-type source region and a $p^+$-type drain region are formed on both sides of the gate electrode.

The element can effect the transistor operation by controlling a voltage applied to the gate electrode as will be described below. For example, if a positive voltage (Vg>0) is applied to the gate electrode, carriers are induced in a portion of the surface area of the silicon substrate which lies directly below the gate electrode so as to form an $n^+$-type channel region. As a result, a pn junction (tunnel diode) is formed of the $n^+$-type channel region and the $p^+$-type drain region.

In the above tunnel diode, when the drain voltage (Vd) is increased in a forward direction, a drain current (Id) increases along an "N"-shaped curve and an Id-Vd characteristic shown in FIG. 1 can be obtained. In the range to the peak point in FIG. 1, the forward current increases due to the tunnel effect, in a range from the peak point to the valley point, the current decreases since the amount of carriers which can tunnel through is reduced. The above Id-Vd characteristic is called a negative resistance characteristic. After the valley point, a diffusion current flows and the current increases.

In the tunnel effect element, the channel region can be controlled only by controlling the gate voltage. Since the depletion layer extends only in a portion near the source region, the punchthrough phenomenon which occurs in the conventional MOS transistor can be substantially eliminated and the element can be treated as an element suitable for miniaturization.

Since the tunnel effect element utilizes a tunnel current having no time delay, the element can be expected to be used as a high-speed element. Further, since the operation voltage of the drain is as low as 1V or less, the element can be practically used as a low-power-consumption element.

In the manufacturing operation, it is necessary to separately effect the ion-implantation processes for implanting ions into the source and drain regions so as to form the p- and n-type regions, but except this process, the element can be manufactured according to the conventional manufacturing process of MOS transistors.

An SRAM for statically storing a storage signal is widely used as one semiconductor memory device. As an SRAM cell, a cell formed of six MOS transistors and a cell formed of four MOS transistors and two high-resistance resistors are known. In either case, it is necessary to use six elements so as to form the SRAM cell.

An SRAM cell which is formed of three elements (two tunnel diodes and one MOS transistor) and effective for high integration is proposed (Jpn. Pat. Appln. KOKAI Publication No.58-153295). FIG. 2 shows the equivalent circuit of such an SRAM cell.

The SRAM cell is constructed by two tunnel (ESAKI) diodes ED1, ED2 series-connected in the forward direction between a high-level voltage source Vdd and a low-level voltage source Vss and a MOS transistor Tr in which one of the source and drain is connected to a connection node N of the tunnel diodes ED1 and ED2, the other one of the source and drain is connected to a bit line BL and the gate is connected to a word line WL.

FIG. 3 shows the current-voltage characteristics of the tunnel diodes ED1, ED2 of the above SRAM. The potential state becomes stable at the intersections $A_0$, $A_1$ between the characteristic curves of the tunnel diodes ED1, ED2 and exhibits latch characteristics. The SRAM utilizes the two stable states for dealing with storage signals.

The operation of writing and reading out a storage signal and the operation of holding (standby) the signal charge are effected by use of the MOS transistor Tr. That is, in the case of writing, the MOS transistor is set into the ON state to electrically connect a selected bit line and the connection node to each other. As a result, charges of an amount corresponding to the product of the parasitic capacitance of the connection node N and the voltage of the bit line BL are stored on the connection node N as a storage signal. The voltage of the bit line BL is selected to set the system to the stable state corresponding to the intersection $A_0$ or $A_1$.

In the case of reading, the MOS transistor is set into the ON state to read the charge stored on the connection node N as the storage signal via a selected bit line BL. In the case of standby, the MOS transistor is kept in the OFF state.

However, the SRAM has the following problem. That is, since a drive current (tunnel current) $I_0$ of constant level always flows in the above SRAM, it is difficult to simultaneously improve the power consumption at the time of standby and the readout speed of the storage signal. This is because it is necessary to reduce the drive current $I_0$ in order to suppress the power consumption at the time of standby and it is necessary to increase the drive current $I_0$ in order to enhance the readout speed.

As described above, the conventional SRAM using tunnel diodes is a memory cell excellent in the high integration but has a problem that it is difficult to simultaneously attain the low power consumption and the high readout speed.

BRIEF SUMMARY OF THE INVENTION

A first object of this invention is to provide a novel structure of a surface tunnel effect element with gate electrode using a tunnel diode suitable for an integrated circuit.

A second object of this invention is to provide a semiconductor memory device including a memory unit effective for high integration, low power consumption and high readout speed by using the above surface tunnel effect element.

In order to attain the above object, a semiconductor device according to a first aspect of this invention comprises a semiconductor substrate having an element region on a main surface thereof; an element isolation region formed to surround the element region on the main surface of the semiconductor substrate; a gate electrode formed over the element region with a gate insulating film disposed therebetween; a first and a second impurity diffusion region formed on a surface of the element region on both sides of at least part of the gate electrode; a first channel region formed in the surface of the element region below the gate electrode between the first and the second impurity diffusion region when a first preset voltage is applied to the gate electrode; and a first tunnel diode formed in a first interface region between the first impurity diffusion region and the first channel region when the first preset voltage is applied to the gate electrode; wherein the first interface region in which the first tunnel diode is formed is formed in position separated from the element isolation region.

In the above semiconductor device, it is preferable that the gate electrode be formed to surround the first impurity diffusion region and the interface region in which the first tunnel diode is formed be formed in position separated from the element isolation region to surround the first impurity diffusion region.

At least part of the gate electrode disposed between the first and the second impurity diffusion region may be formed to substantially cross the element region.

Alternatively, the second impurity diffusion region may be formed to surround the gate electrode.

Further, the first impurity diffusion region may be formed to surround the gate electrode, the gate electrode may be formed to surround the second impurity diffusion region, and the interface region in which the tunnel diode is formed may be formed in position separated from the element isolation region to surround the gate electrode.

When a potential difference is applied between the first and the second impurity diffusion region and the preset voltage is applied to the gate electrode, a negative resistance characteristic appears in the interface region formed in position separated from the element isolation region.

The first and the second impurity diffusion region may have a different conductivity type to each other or the same conductivity type.

It is also possible to form a convex portion formed of the semiconductor substrate in the element region, form the first impurity diffusion region on an upper surface portion of the convex portion, insulatively form the gate electrode over a side surface of the convex portion, and form the second impurity diffusion region on a region of the surface of the element region which surrounds the gate electrode.

Alternatively, it is also possible to form a convex portion formed of the semiconductor substrate in the element region, form the second impurity diffusion region on an upper surface portion of the convex portion, insulatively form the gate electrode over a side surface of the convex portion, and form the first impurity diffusion region on a region of the surface of the element region which surrounds the gate electrode.

The semiconductor substrate may have a base substrate, an insulating layer formed on the base substrate and a semiconductor layer formed on the insulating layer, the element isolation region and the first and the second impurity diffusion region may be formed on a surface area of the semiconductor layer and the gate electrode may be insulatively formed over the semiconductor layer.

It is preferable to set the impurity concentration of the interface region in which the first tunnel diode is formed in a range of $10^{19}$ cm$^{-3}$ to $10^{22}$ cm$^{-3}$.

The semiconductor device further comprises a second channel region formed in the surface area of the element region which lies below the gate electrode between the first and the second impurity diffusion region when a second preset voltage is applied to the gate electrode; and a second tunnel diode formed in a second interface region between the second impurity diffusion region and the second channel region when the second preset voltage is applied to the gate electrode; and the second interface region in which the second tunnel diode is formed may be formed in position separated from the element isolation region.

A semiconductor device according to a second aspect of this invention comprises a semiconductor substrate having an element region on a main surface thereof; an element isolation region formed to surround the element region on the main surface of the semiconductor substrate; a gate electrode having a plurality of openings and formed over the element region with a gate insulating film disposed therebetween; a plurality of impurity diffusion regions formed on those portions of the semiconductor substrate which are in the plurality of openings, each of the plurality of diffusion regions having an impurity concentration in a range of $10^{19}$ cm$^{-3}$ to $10^{22}$ cm$^{-3}$; and a channel region formed in the main surface of the semiconductor substrate between at least one pair of adjacent impurity diffusion regions among the plurality of impurity diffusion regions when a preset voltage is applied to the gate electrode.

When the preset voltage is applied to the gate electrode and a preset potential difference is applied between the at least one pair of adjacent impurity diffusion regions, a tunnel diode is formed between the channel region and one region of the at least one pair of adjacent impurity diffusion regions.

The plurality of impurity diffusion regions include another pair of adjacent impurity diffusion regions different from the at least one pair of adjacent impurity diffusion regions and the another pair of adjacent impurity diffusion regions has a conductivity type opposite to a conductivity type of the semiconductor substrate and can construct a MOS transistor in cooperation with the gate electrode.

The plurality of impurity diffusion regions include another pair of adjacent impurity diffusion regions different from the at least one pair of adjacent impurity diffusion regions and the another pair of adjacent impurity diffusion regions has the same conductivity type as that of the semiconductor substrate and permit a resistor to be formed between two regions of the another pair of adjacent impurity diffusion regions.

The semiconductor device has two pairs of impurity diffusion regions as the at least one pair of adjacent impurity diffusion regions, when the preset voltage is applied to the gate electrode and the preset potential difference is applied between two regions of the adjacent impurity diffusion regions in each pair, a tunnel diode is formed between the channel region and one of the adjacent impurity diffusion regions, and the two pairs of adjacent impurity diffusion regions can be connected to each other so as to form a serially connected tunnel diodes with a PNPN arrangement.

A semiconductor device according to a third aspect of this invention comprises a semiconductor substrate having a main surface; an inter-level insulating film formed on the main surface of the semiconductor substrate; a rectangular parallelepiped semiconductor layer formed to extend on the inter-level insulating film; a gate insulating film formed to surround a peripheral portion of a central portion of the rectangular parallelepiped semiconductor layer in a lengthwise direction; a gate electrode formed to surround the peripheral portion of the central portion of the rectangular parallelepiped semiconductor layer in the lengthwise direction with the gate insulating film disposed therebetween and formed to enter part of the inter-level insulating film; a first and a second impurity diffusion region formed on portions of the rectangular parallelepiped semiconductor layer which lie on both sides of the gate electrode and formed to extend into under the gate electrode; a channel region formed in a surface area of the rectangular parallelepiped semiconductor layer which lies under the gate electrode between the first and the second impurity diffusion region when a preset voltage is applied to the gate electrode; and a tunnel diode formed in an interface region between the channel region and one of the first and the second impurity diffusion region under the gate electrode when a preset voltage is applied to the gate electrode and a preset potential difference is applied between the first and the second impurity diffusion region.

It is preferable to set the impurity concentration of the interface region in which the tunnel diode is formed in a range of $10^{19}$ cm$^{-3}$ to $10^{22}$ cm$^{-3}$.

A semiconductor device according to a fourth aspect of this invention comprises a semiconductor substrate; a first surface tunnel effect element formed on the semiconductor substrate, the first surface tunnel effect element including a source region connected to a first voltage source and selectively formed on a surface of the semiconductor substrate, a drain region of high impurity concentration selectively formed on the surface of the semiconductor substrate in position different from the source region, and a first gate electrode formed over a portion of the surface of the semiconductor substrate which lies between the source region and the drain region and insulated from the semiconductor substrate, the first gate electrode forming a channel region of high carrier density in the portion of the surface of the substrate between the drain region and the source region when a preset voltage is applied thereto; and a load connected at one end thereof to the drain region of the first surface tunnel effect element and connected at the other end to a second voltage source; wherein the first surface tunnel effect element and the load constitute a memory unit, a gate voltage of low level is applied to the first gate electrode of the first surface tunnel effect element in a storage signal holding period, and a gate voltage of high level is applied to the first gate electrode of the first surface tunnel effect element at a time of storage signal reading.

The load can be one selected from a group consisting of a second surface tunnel effect element, a MOS transistor, a tunnel diode, a resistive element and a resonant tunnel effect element.

It is preferable to select one of a second surface tunnel effect element and a MOS transistor, which has a second gate electrode, as the load and provide a gate terminal to which the first gate electrode of the first surface tunnel effect element and the second gate electrode are connected.

It is preferable to connect a refresh circuit for outputting a preset pulse signal in a preset cycle to the gate terminal.

It is possible to select one of a second surface tunnel effect element and a MOS transistor, which has a second gate electrode, as the load, apply a fixed gate voltage to one of the first gate electrode of the first surface tunnel effect element and the second gate electrode and apply a gate voltage which varies until a stable operation voltage thereof is obtained to the other of the first gate electrode and the second gate electrode.

If an inversion layer is formed in the channel region by applying a preset voltage to the gate electrode of the surface tunnel effect element with gate electrode, a tunnel diode is formed between the inversion layer and the source-drain diffusion region of a conductivity type opposite to that of the inversion layer. As a result, a system constructed by the surface tunnel effect element with gate electrode and the load can take a plurality of stable states. The plurality of stable states are utilized for dealing with storage signals.

A tunnel current of the tunnel diode formed as described above can be controlled by a gate voltage. That is, as the carrier density in the inversion layer is increased by adjusting the gate voltage level, the tunnel current becomes larger. Thus, the tunnel current (driving current) can be increased and the storage signal can be read at high speed. On the other hand, at the standby time, the tunnel current (driving current) can be suppressed to a small value and the power consumption at the standby time can be reduced.

Further, according to the fourth aspect of this invention, since the memory unit can be formed of two constituents: the tunnel effect element with gate electrode and the load, high integration can be easily attained. Therefore, a memory unit (memory cell) which is effective for high integration, low power consumption and high-speed operation can be realized.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5 is a drain voltage-drain current characteristic diagram of an element shown in FIGS. 4A to 4C;

FIG. 7 is a diagram showing the drain voltage-drain current characteristic of the semiconductor device of the first embodiment;

FIG. 8 is a cross sectional view showing a modification of the first embodiment;

FIG. 9 is a plan view showing another modification of the first embodiment;

FIG. 12A is a plan view device aa semiconductor device according to a third embodiment of this invention;

FIG. 12B is a cross sectional view taken along the line 12B—12B of FIG. 12A;

DETAILED DESCRIPTION OF THE INVENTION

Before explaining the embodiments of this invention, the problem of the W. Hönlein et al. device is explained. In order to determine whether the element can be applied to an integrated circuit or not, the inventor of this application formed the element on an element region surrounded by an element isolation region and checked the electrical characteristic thereof. In order to form elements on the substrate surface with high integration density as in the integrated circuit of the present day, it is necessary to form the element isolation region for electrically isolating the adjacent elements from each other.

Figure 4A:
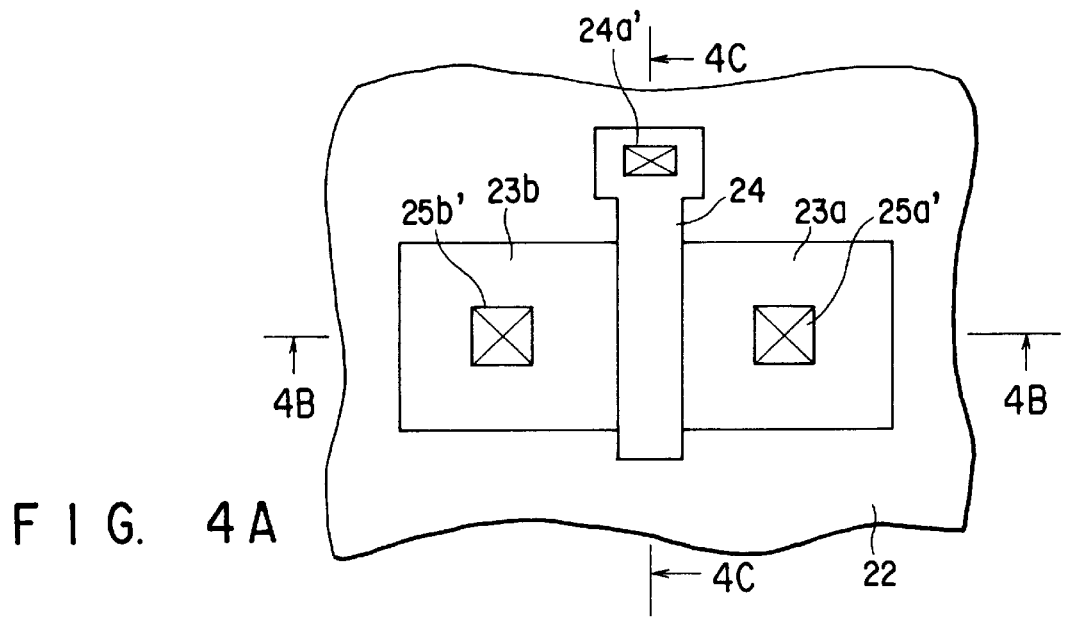
FIG. 4A is a plan view for illustrating a surface tunnel effect element with gate electrode for an integrated circuit formed as an experiment by the inventor of this application.
Figure 4B:
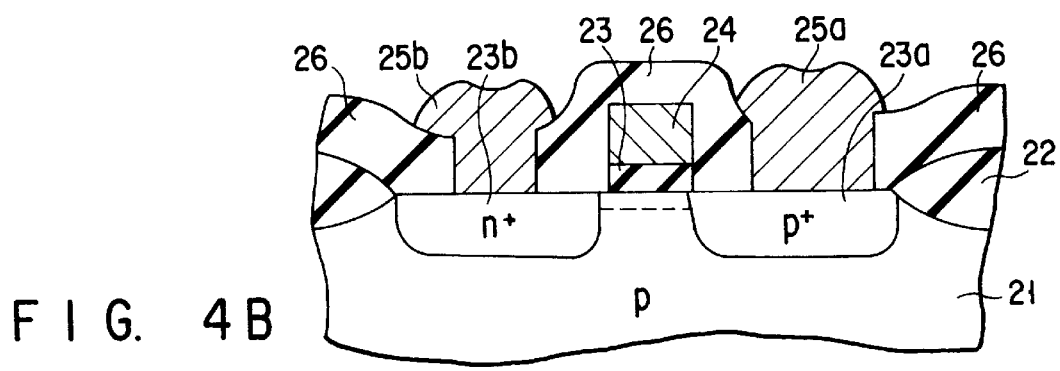
FIG. 4B is a cross sectional view taken along the line 4B—4B of FIG. 4A.
Figure 4C:
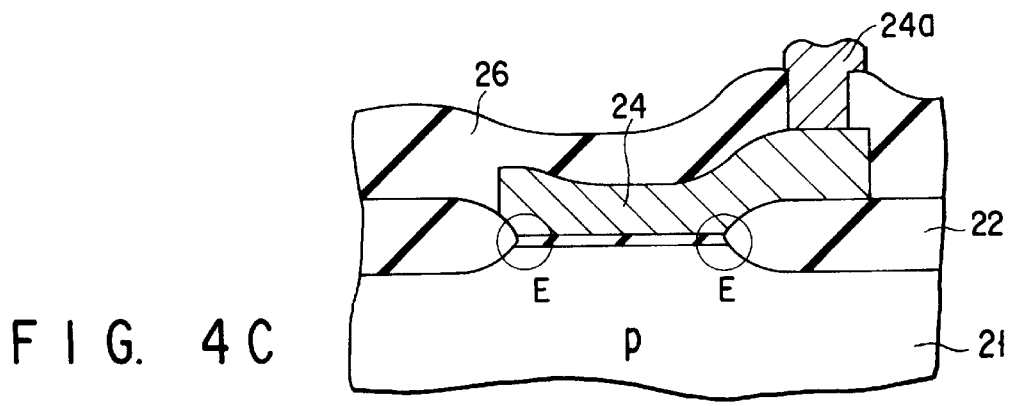
FIG. 4C is a cross sectional view taken along the line 4C—4C of FIG. 4A.

FIG. 4A is a plan view of an element formed as an experiment by the inventor and FIGS. 4B and 4C are cross sectional views taken along the line 4B—4B and the line 4C—4C of FIG. 4A. In this case, in the plan view of FIG. 4A, an insulating film 26 covering the element region is omitted. A gate electrode 24 is formed above the surface of a silicon substrate 21 with a gate insulating film 23 disposed therebetween. An $n^+$-type source region 23b and a $p^+$-type drain region 23a are formed on both sides of the gate electrode 24 on the surface of the silicon substrate 21 in the element region defined by an element isolation region 22. A gate contact 24a, source contact 25b and drain contact 25a which act as connection terminals for connection with the exterior are respectively formed on the gate electrode 24, source region 23b and drain region 23a. Reference numerals 24a', 25a', 25b' in FIG. 4A respectively indicate contact regions to which the gate contact 24a, drain contact 25a and source contact 25b are respectively connected.

As shown in FIG. 4B, the gate electrode 24 and the source/drain regions 23a, 23b are formed in the element region defined by the LOCOS (Local Oxidation of Silicon) formed on the surface of the silicon substrate 21 and an inter-level insulating film 26 is formed to cover the above electrode and regions on the surface of the semiconductor substrate 21.

The Id-Vd characteristics of the above element at the room temperature (approx. 300K) and at 80K are shown in FIG. 5. The characteristic obtained when the gate voltage is set at 0V is indicated by broken lines and the characteristic obtained when the gate voltage is set at 7V is indicated by solid lines. When a positive voltage was applied to the gate electrode, a tunnel diode would be formed between the channel region and the $p^+$-type drain region and the negative resistance characteristic should be observed, but actually, as shown in FIG. 5, the negative resistance could not be observed.

The inventor supposed that occurrence of the above problem might be caused by the effect of the end portion of the element isolation region. As shown in the cross section of FIG. 4C, stress is applied to the end portion E of the element isolation region and the defect caused by the stress acts as a level in the silicon substrate surface area near the end portion. Then, a leakage current flows via the level. In the element utilizing the tunnel effect, a current due to the negative resistance characteristic is small, and therefore, it is considered that the negative resistance characteristic will not appear because of the flow of the leakage current.

This invention has been made to solve the above problem and provide a surface channel effect element suitable for integration. There will now be described embodiments of this invention with reference to the accompanying drawings.

(First Embodiment)

Figure 6A:
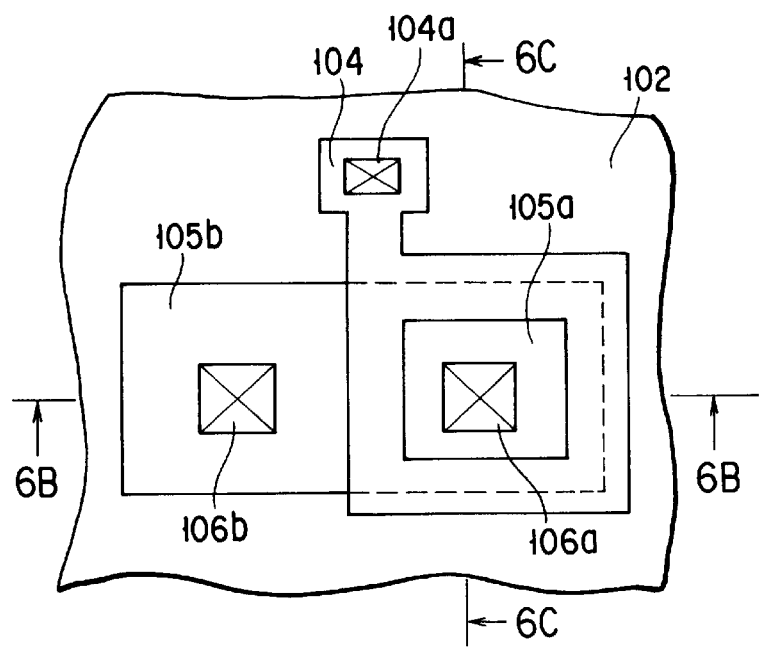
FIG. 6A is a plan view showing a semiconductor device according to a first embodiment of this invention.
Figure 6B:
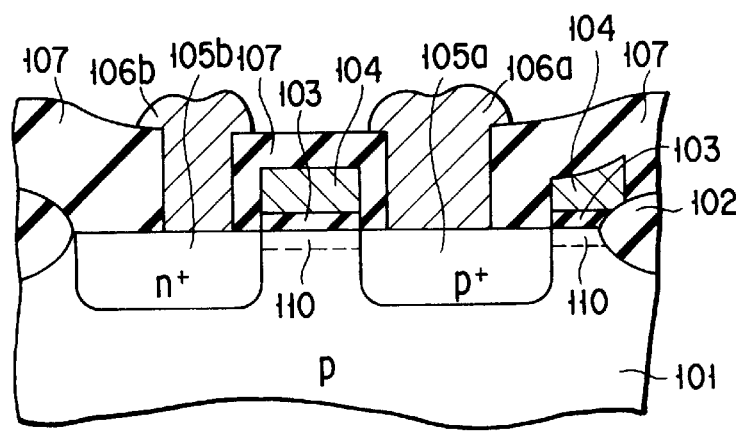
FIG. 6B is a cross sectional view taken along the line 6B—6B of FIG. 6A.
Figure 6C:
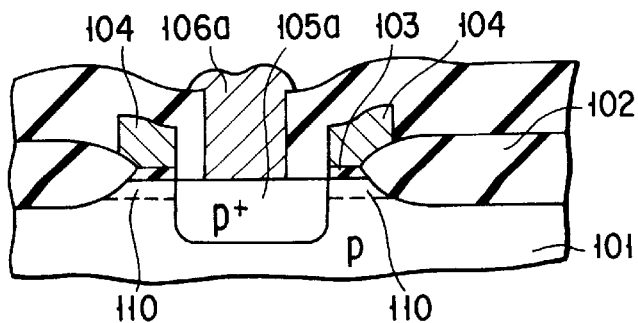
FIG. 6C is a cross sectional view taken along the line 6C—6C of FIG. 6A.

FIG. 6A is a plan view showing a semiconductor device according to a first embodiment of this invention, and FIGS. 6B, 6C are cross sectional views taken along the line 6B—6B and the line 6C—6C of FIG. 6A. In FIG. 6A, an inter-level insulating film 107 formed on a silicon substrate 101 including the element region is omitted.

A gate electrode 104 is formed to surround a $p^+$-type drain region 105a which is formed in position separated from an element isolation region 102. An $n^+$-type source region 105b and the $p^+$-type drain region 105a are formed on both sides of part of the gate electrode in the element region. A gate contact 104a is connected to the gate electrode above the element isolation region to prevent delay due to capacitance.

As shown in FIG. 6B, a source contact 106b and drain contact 106a are formed in openings formed in the inter-level insulating film 107 on the substrate 101 to reach the source region 105b and drain region 105a.

When a positive voltage (for example, 3V) is applied to the gate electrode 104 in the first embodiment, an inversion layer (of $n^+$ type) 110 is formed in the surface area of the silicon substrate 101 and a tunnel diode is formed around the $p^+$-type drain region 105a surrounded by the gate electrode 104.

As shown in FIG. 7, in the Id-Vd characteristic of the MOS tunnel effect element obtained by eliminating the influence of the end portion of the element isolation region, the negative resistance characteristic will appear if the gate voltage Vg of approx. 3V or more is applied. Therefore, a surface tunnel effect element with gate electrode exhibiting an excellent tunnel effect can be attained by forming the gate electrode to surround the drain region 105a and forming the drain region 105a in position separated from the element isolation region 102 as in the first embodiment.

Further, in the first embodiment, the four sides of the $p^+$-type drain region can be used, a sufficient amount of current can be obtained without increasing the device area.

In the first embodiment, a case wherein the inversion layer is formed is explained, but the same effect can be attained by forming the gate electrode around the n$^+$-type source region in which a tunnel diode is formed in a case where a carrier accumulation layer (p$^+$ type) is formed below the gate electrode by applying a negative voltage to the gate electrode.

Further, when the source and drain regions are formed of the same conductivity type and the channel region is formed of a conductivity type opposite to the above conductivity type, the above effect can be attained by forming the gate electrode to surround at least the impurity region in which a pn junction to which a forward bias voltage is applied is formed. For example, in FIG. 8, if n$^+$-type diffusion regions 105b, 105c are formed on the p-type substrate 101, the contact 106a is set to the reference potential, the contact 106b is set to a positive potential with respect to the contact 106a, and the gate electrode 104 is kept at a negative potential with respect to the contact 106a, then a p$^+$-type accumulation layer is formed in the channel region 110 and a tunnel diode is formed in the interface between the channel region 110 and the diffusion layer 105c. Therefore, it is only required to form the gate electrode 104 to surround the diffusion layer 105c.

Further, even when the gate electrode is not formed to surround the impurity diffusion layer, the influence by the end portion of the element isolation region can be eliminated and the effect of this invention can be attained if a portion of the impurity diffusion region which is formed in contact with the channel region to form a tunnel diode is formed in position separated from the end portion of the element isolation region. For example, as shown in FIG. 9, the gate electrode 104 is formed between the impurity diffusion regions 105a and 105b and the periphery of the impurity diffusion region 105a which is not formed in contact with the gate electrode 104 may be surrounded by a semiconductor substrate region 105d in which no impurity is diffused. With this structure, a tunnel diode which is formed in the interface between the impurity diffusion region 105a and the channel region formed under the gate electrode 104 can be separated from the element isolation region 102.

Figure 10A:
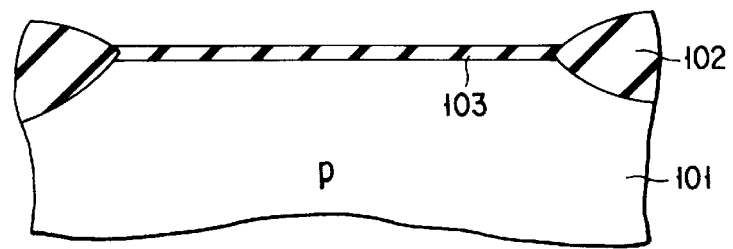
FIGS. 10A to 10E are cross sectional views sequentially showing the steps of a manufacturing method for manufacturing the semiconductor device of the first embodiment.

Next, one example of a method for manufacturing the device of the first embodiment is explained with reference to FIGS. 10A to 10E. First, after the element isolation region 102 is formed on the p-type silicon substrate 101 by the LOCOS method, a thermal oxide film 103 of approximately 5 nm thickness is formed on the surface of the silicon substrate 101 (FIG. 10A).

Figure 10B:
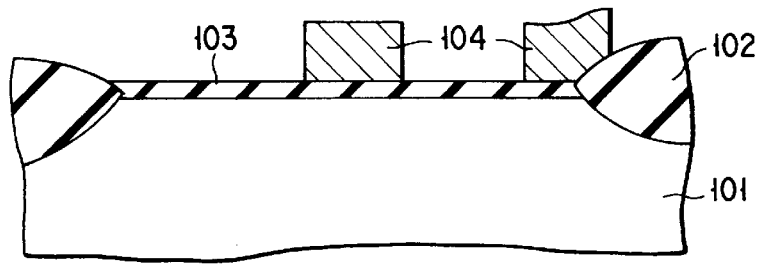

Then, a polysilicon film is formed on the surface of the silicon substrate 101 while doping n-type impurity such as P, As by the LPCVD (Low Pressure Chemical Vapor Deposition) method or the like and the polysilicon film is processed by the lithography process and an anisotropic etching process such as RIE (Reactive Ion Etching) process to form a gate electrode 104 (FIG. 10B).

Figure 10C:
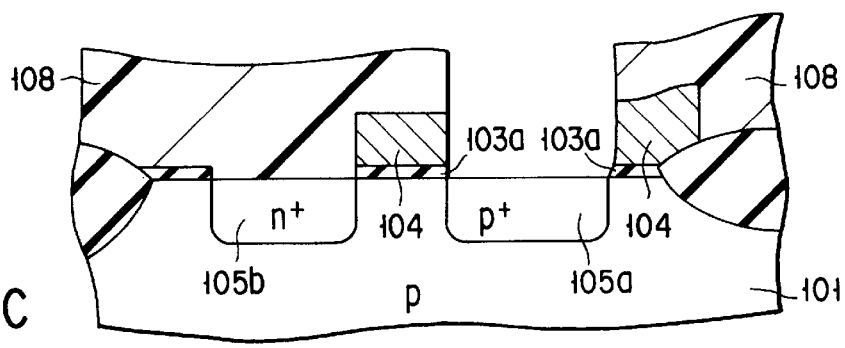

After this, a photoresist (not shown) is formed on a portion except a source forming region 105b and n-type impurity such as P, As, in this example, As is ion-implanted in a condition of 30 keV and 2×10$^{15}$ cm$^{-2}$ with the photoresist used as a mask. After removing the photoresist by ashing or the like, a photoresist 108 is formed on a portion except a drain forming region 105a surrounded by the inner periphery of the gate electrode 104 as shown in FIG. 10C. Then, p-type impurity BF$_2$ ions are ion-implanted in a condition of 60 keV and 5×10$^{15}$ cm$^{-2}$ with the photoresist 108 used as a mask.

Figure 10D:
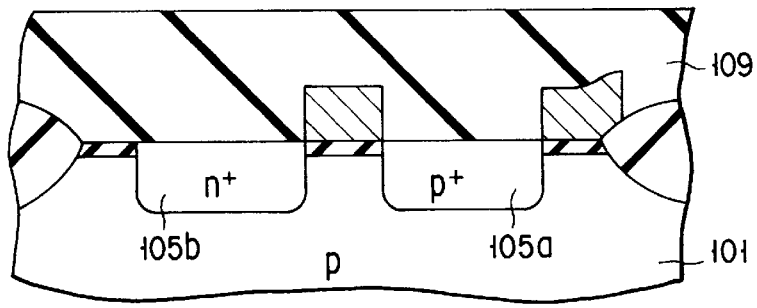
Figure 10E:
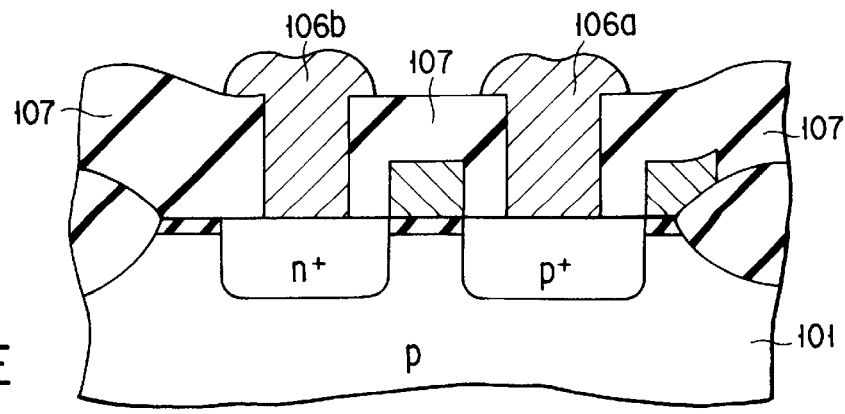

Next, after the photoresist is removed, an insulating film such as a silicon oxide film is formed as an inter-level insulating film 109 on the surface of the silicon substrate 101 by the LPCVD method or the like (FIG. 10D). Then, the impurities doped into the source and drain forming regions 105b, 105a are activated by the heat treatment to form source and drain regions 105b, 105a. In order to attain an excellent tunnel effect, it is preferable to set the impurity concentration of the source and drain regions 105b, 105a in the range of 10$^{19}$ to 10$^{22}$ cm$^{-3}$. As a result, the impurity concentration of the boundary region which is formed between the source/drain region and the channel region and in which a tunnel diode is formed can be set in the range of 10$^{19}$ to 10$^{22}$ cm$^{-3}$.

Next, a photoresist (not shown) is formed to expose only the surface portions of the inter-level insulating film 109 which lie above forming regions of a gate contact 104a, source contact 106b and drain contact 106a and openings are formed in the inter-level insulating film 109 by the etching process such as RIE with the photoresist used as a mask. Then, a metal film of a wiring material such as Al is deposited on the surface of the substrate 101 by the sputtering method or the like. The deposited metal film is subjected to the lithography process and etching process to form the gate contact 104a (shown in FIG. 6A), drain contact 106a and source contact 106b and thus the surface tunnel effect element with gate electrode of the first embodiment is completed.

As described above, since the tunnel effect element of this invention can be manufactured by a simple process, it is easy to form the gate electrode having a width of 0.1 μm or less.

(Second Embodiment)

Figure 11A:
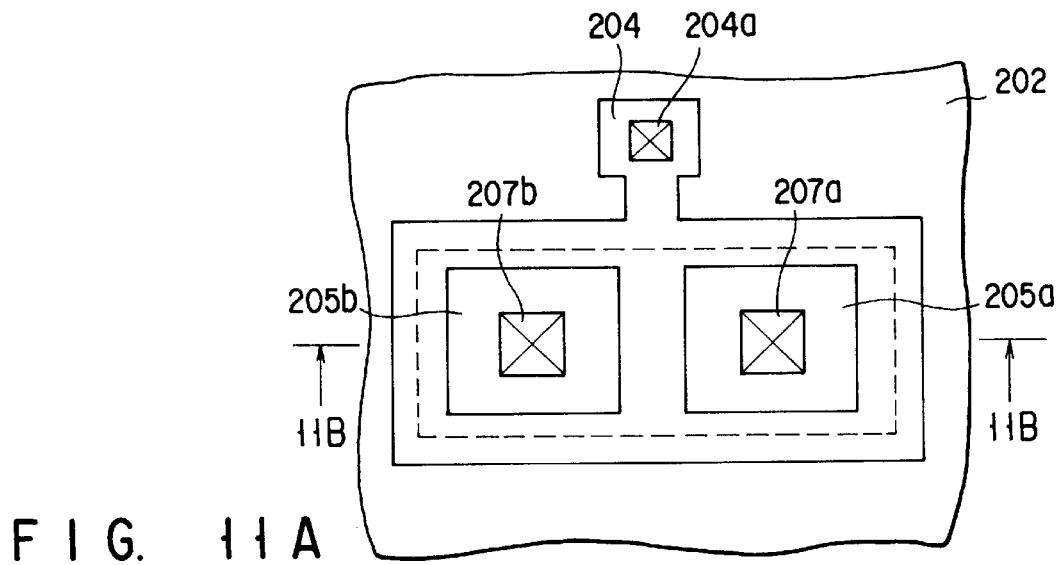
FIG. 11A is a plan view showing a semiconductor device according to a second embodiment of this invention.
Figure 11B:
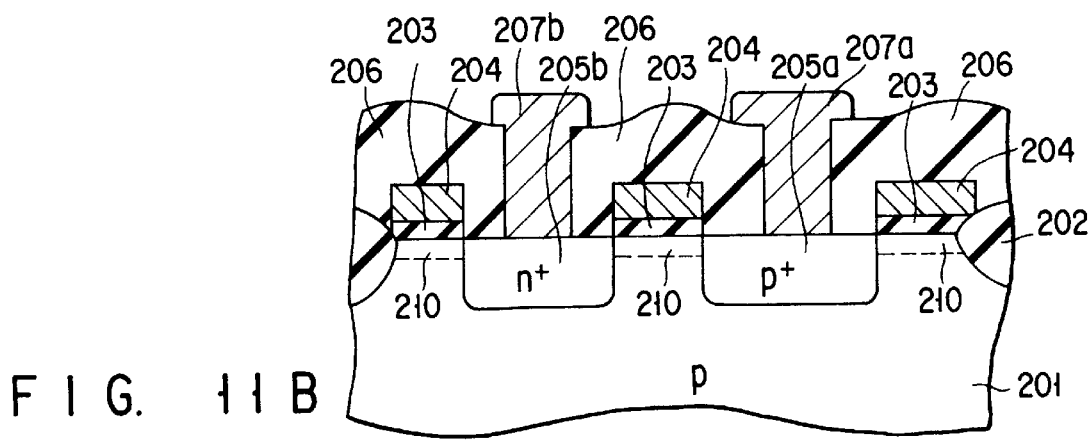
FIG. 11B is a cross sectional view taken along the line 11B—11B of FIG. 11A.
Figure 13A:
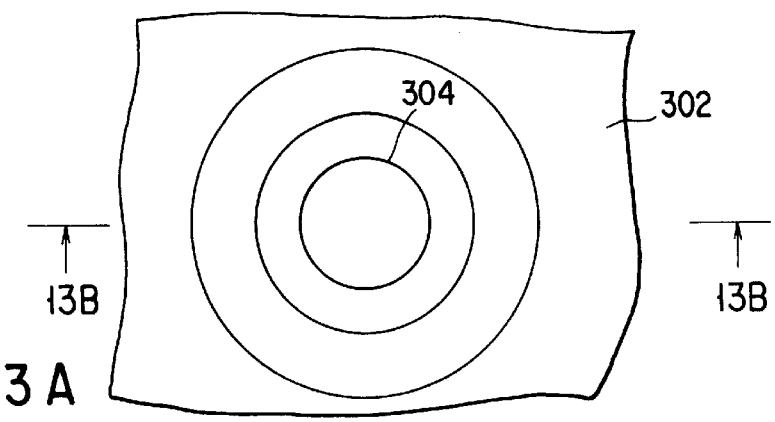
FIGS. 13A and 13B are views for illustrating one step of a manufacturing process for manufacturing the semiconductor device of the third embodiment, FIG. 13A being a plan view and FIG. 13B being a cross sectional view taken along the line 13B–13B of FIG. 13A.
Figure 13B:
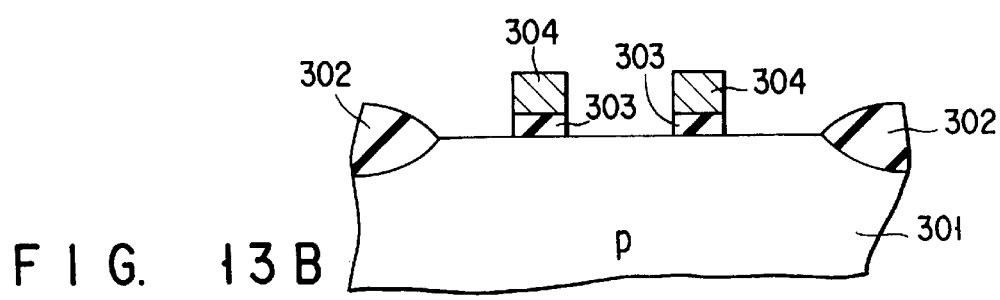

FIG. 11A is a plan view for illustrating a second embodiment of this invention, and FIG. 11B is a cross sectional view taken along the line 11B—11B of FIG. 11A. In FIG. 11A, an inter-level insulating film 206 formed to cover the element region and an element isolation region 202 is omitted.

The second embodiment is different from the first embodiment in that a gate electrode 204 is formed to surround both of the source and drain regions 205b and 205a, and therefore, not only the drain region 205a but also the source region is formed in position separated from the element isolation region 202.

The operation of the second embodiment is explained below. For example, if a p-type silicon substrate 201 is used and a positive voltage is applied to the gate electrode 204, an inversion layer is formed as a channel layer 210 in the substrate surface area directly under the gate electrode 204. A tunnel diode is formed between the inversion layer and the p$^+$-type impurity diffusion region. If a forward bias voltage is applied to the tunnel diode and the forward bias voltage is increased, a negative differential resistance characteristic appears.

If a negative voltage is applied to the gate electrode 204, an accumulation layer is formed as the channel layer 210 in the substrate surface area directly under the gate electrode 204. A tunnel diode is formed between the accumulation layer and the n$^+$-type impurity diffusion region. If a forward bias voltage is applied to the tunnel diode and the forward bias voltage is increased, a negative differential resistance characteristic appears.

Also, in the second embodiment, since the element structure in which the influence by the end portion of the element isolation region 202 is eliminated is provided, an excellent negative differential resistance characteristic can be attained. Further, the effect that a large current can be obtained can be attained as in the first embodiment. However, the second embodiment is different from the first embodiment in that the tunnel diode can be formed in the end portion of either of the impurity diffusion regions by controlling the potential of the gate electrode.

The second embodiment can be attained by substantially the same method as in the first embodiment except that a photoresist mask for forming the gate electrode is prepared in a form corresponding to the gate electrode 204. Therefore, the detail explanation for the manufacturing method is omitted.

(Third Embodiment)

FIG. 12A is a plan view for illustrating a semiconductor device according to a third embodiment of this invention, and FIG. 12B is a cross sectional view taken along the line 12B—12B of FIG. 12A. In FIG. 12A, an inter-level insulating film 307 formed to cover a substrate 301 is omitted.

An element isolation region 302 surrounding the element region is formed on the silicon substrate 301. An n$^+$-type source region 305b is formed in the central portion of the element region and a gate insulating film 303 and gate electrode 304 are formed to surround the source region 305b on the silicon substrate 301. A drain region 305a is formed on the surface area of the substrate 301 outside the gate electrode 304. A gate contact 304a, drain contact 306a and source contact 306b which are electrically isolated from one another by the inter-level insulating film 307 are respectively formed on the gate electrode 304, drain region 305a and source region 305b.

Since the gate electrode is thus formed completely separately from the element isolation region, the boundary region in which the tunnel diode is formed is made completely free from the influence of the end portion of the element isolation region. Therefore, in the Id-Vd characteristic of the surface channel effect element, a negative resistance characteristic appears when the gate voltage Vg is applied to form a tunnel junction and the drain voltage is increased. Further, since the portions around all sides of the impurity region can be used as tunnel diodes, an amount of current can be increased without increasing the area of the device.

A method for manufacturing the semiconductor device of the third embodiment is explained with reference to FIGS. 13A, 13B, 14A, 14B, and 15. First, for example, an element isolation region 302 surrounding the element region of a p-type silicon substrate 301 is formed by the LOCOS method or the like. Then, a thermal oxide film is formed on the silicon substrate surface and a polysilicon film is formed on the thermal oxide film by the LPCVD method or the like. After this, a photoresist mask (not shown) is formed on the polysilicon film, and the polysilicon film and thermal oxide film are subjected to the etching process such as the RIE method to form a gate electrode 304 and gate insulating film 303. The state thus obtained is shown in the plan view of FIG. 13A and the cross section of FIG. 13B.

Figure 14A:
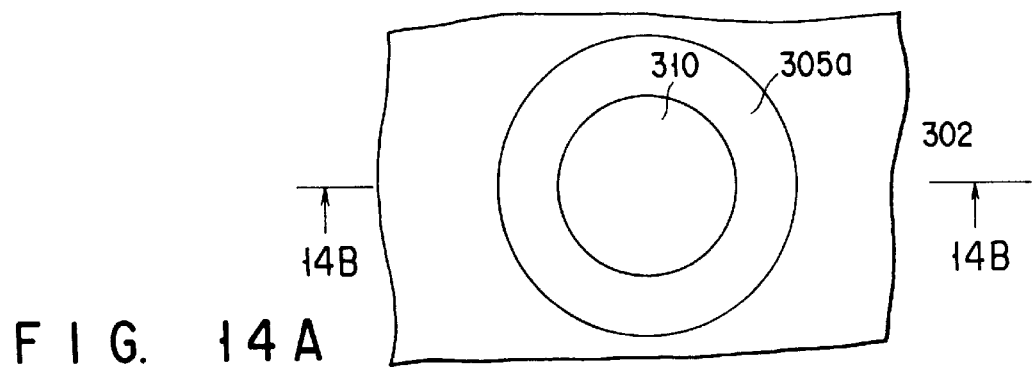
FIGS. 14A and 14B are views for illustrating a step which follows the step of FIGS. 13A, 13B in the manufacturing process for manufacturing the semiconductor device of the third embodiment, FIG. 14A being a plan view and FIG. 14B being a cross sectional view taken along the line 14B—14B of FIG. 14A.
Figure 14B:
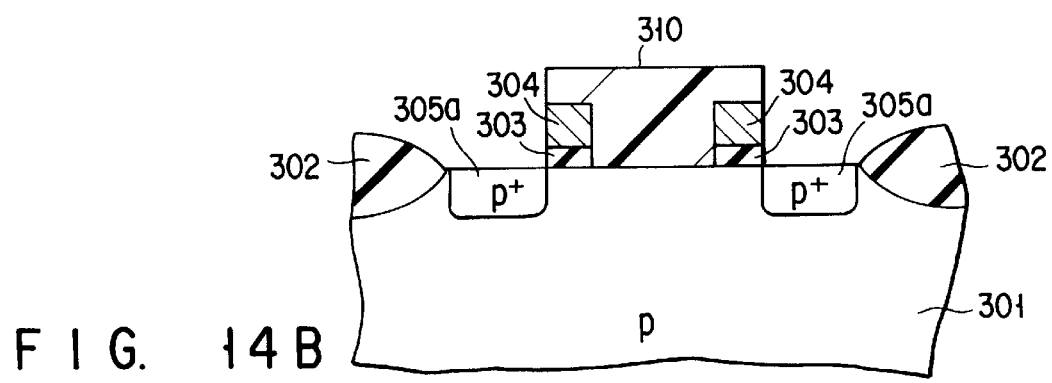

Next, as shown in the plan view of FIG. 14A and the cross sectional view of FIG. 14B, a photoresist mask (not shown) is formed to cover the gate electrode 304 and the internal portion thereof, and impurity ions are ion-implanted into a drain forming region 305a. If a drain region of p-type is formed, p-type impurity such as BF$_2$ is ion-implanted.

Figure 15:
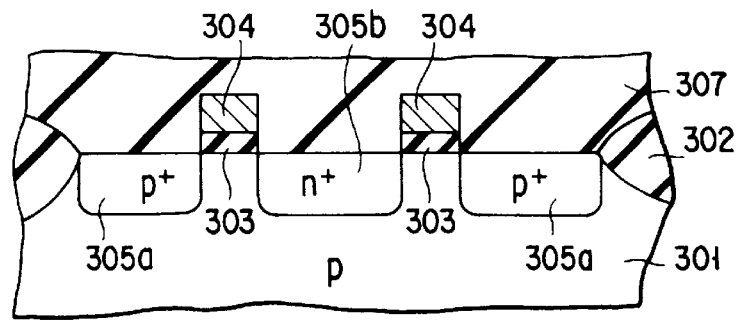
FIG. 15 is a cross sectional view for illustrating a step which follows the step of FIG. 14B in the manufacturing process for manufacturing the semiconductor device of the third embodiment.

Next, as shown in the cross sectional view of FIG. 15, n-type impurity such as P, As is ion-implanted in order to form a source region 305b and an inter-level insulating film 307 is formed on the silicon substrate 301.

Then, openings are formed in the inter-level insulating film 307 to form contacts of the gate electrode 304, source region 305b and drain region 305a. A metal film of Al, for example, is formed on the silicon substrate 301 by the sputtering method or the like and then the etching process such as the RIE method is effected by using the metal film as a photoresist mask so as to form a gate contact 304a, drain contact 306a and source contact 306b, and thus the surface tunnel effect element of this embodiment is completed.

(Fourth Embodiment)

Figure 16A:
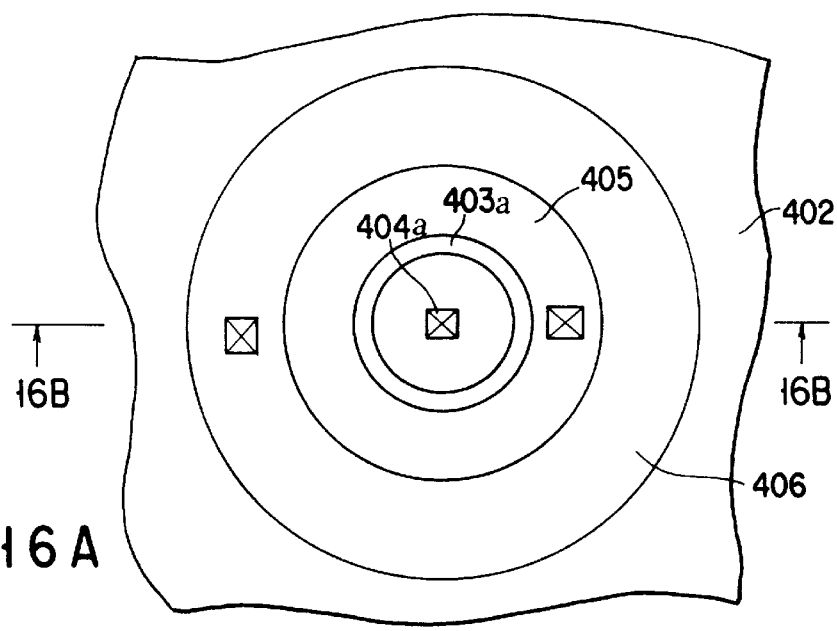
FIG. 16A is a plan view showing a semiconductor device according to a fourth embodiment of this invention.
Figure 16B:
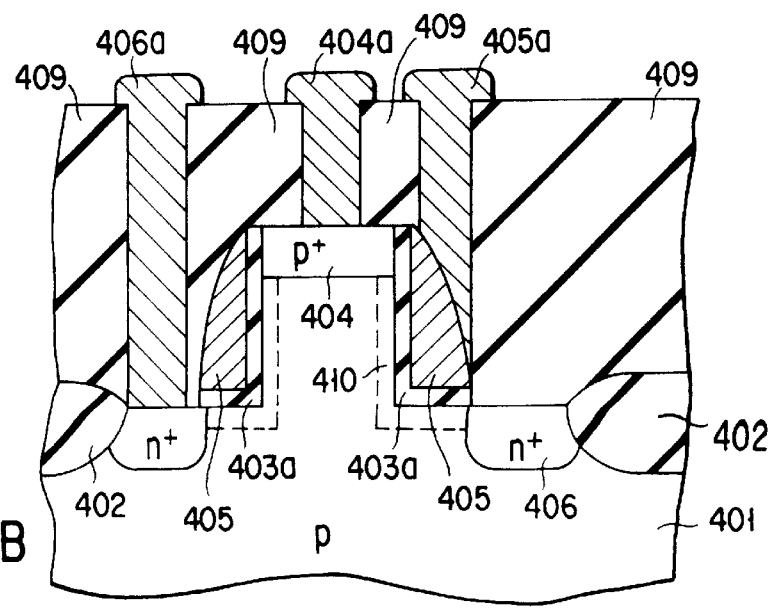
FIG. 16B is a cross sectional view taken along the line 16B—16B of FIG. 16A.

FIG. 16A is a plan view for illustrating a fourth embodiment of this invention, and FIG. 16B is a cross sectional view taken along the line 16B—16B of FIG. 16A. In FIG. 16A, an inter-level insulating film 409 formed on the element region of the substrate and an element isolation region is omitted.

In the element region defined by an element isolation region 402 formed on the surface of a silicon substrate 401, an n$^+$-type source region 406, a gate electrode 405 and a p$^+$-type drain region 404 are formed. The drain region 404 is formed on the upper surface of a convex portion of the silicon substrate 401 which is shaped in a 3-dimensional form and the gate electrode 405 is formed over the side wall portion of the convex portion with a gate insulating film 403a disposed therebetween. The source region 406 is formed on the substrate 401 to surround the periphery of the gate electrode 405. Further, a gate contact 405a, drain contact 404a and source contact 406a which are electrically isolated from one another by the inter-level insulating film 409 are formed on the gate electrode 405, drain region 404 and source region 406, respectively.

In the fourth embodiment, a storage layer or inversion layer is formed in the surface area of the silicon substrate 401 (the side surface area of the convex portion and the ring-form flat surface area surrounding the convex portion) which faces the gate electrode with the gate insulating film 403a disposed therebetween by controlling a voltage applied to the gate electrode 405. The layer is used as a channel region 410. A tunnel diode is formed in the interface region between the channel region and either of the impurity regions.

Figure 17A:
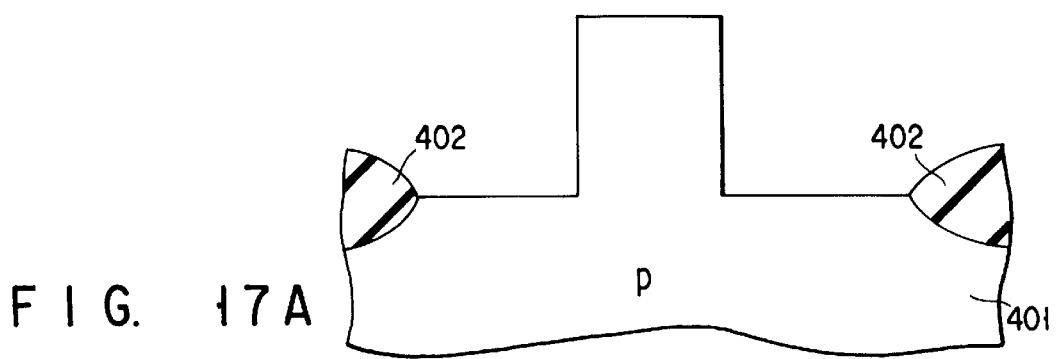
FIGS. 17A to 17D are cross sectional views sequentially showing the steps of a manufacturing process for manufacturing the semiconductor device of the fourth embodiment.

Next, a method for manufacturing the semiconductor device of the fourth embodiment is explained with reference to FIGS. 17A to 17D. First, as shown in FIG. 17A, a convex portion is formed in the central area of the element region of a p-type silicon substrate 401, for example, by the photolithography and the anisotropic etching process such as RIE and an element isolation region 402 is formed by the LOCOS method or the like.

Figure 17B:
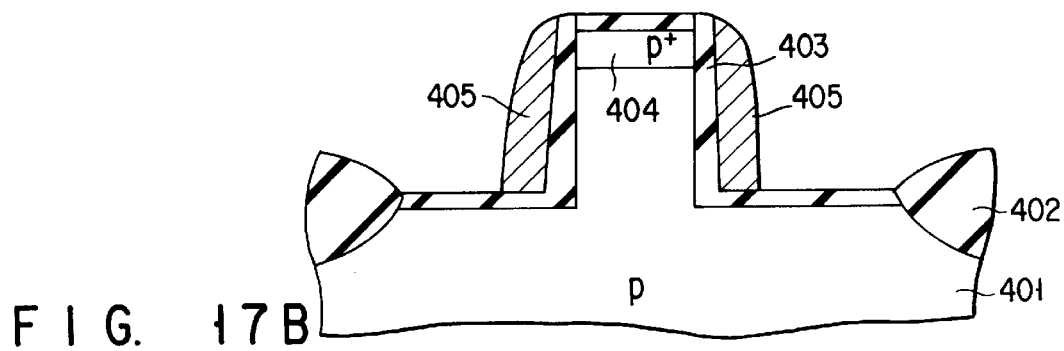

Then, a thermal oxide film 403 is formed on the surface of the silicon substrate 401, a polysilicon film is formed on the thermal oxide film 403 by the LPCVD method or the like, and diffusion of phosphorus is effected at 850° C. for 30 minutes. After this, the polysilicon film is subjected to the etching process such as the RIE method to be left behind only on the side wall portion of the convex portion so as to form a gate electrode 405 as shown in FIG. 17B. Then, p-type impurity is ion-implanted with high impurity concentration into the drain forming region 404 on the upper surface of the convex portion of the silicon substrate 401.

Figure 17C:
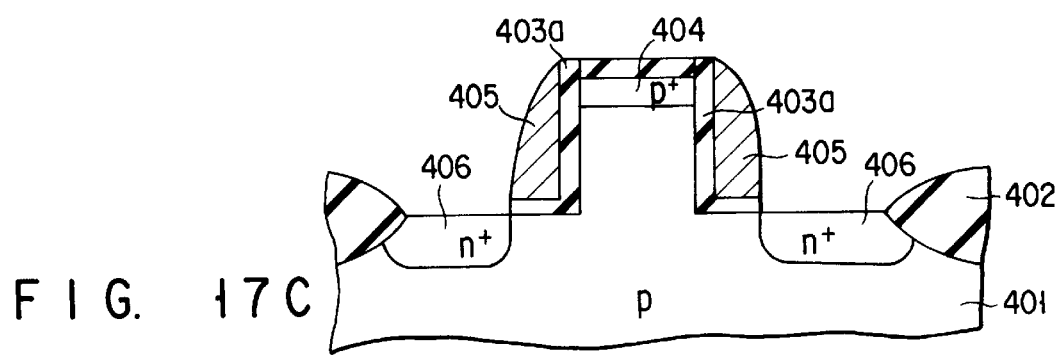
Figure 17D:
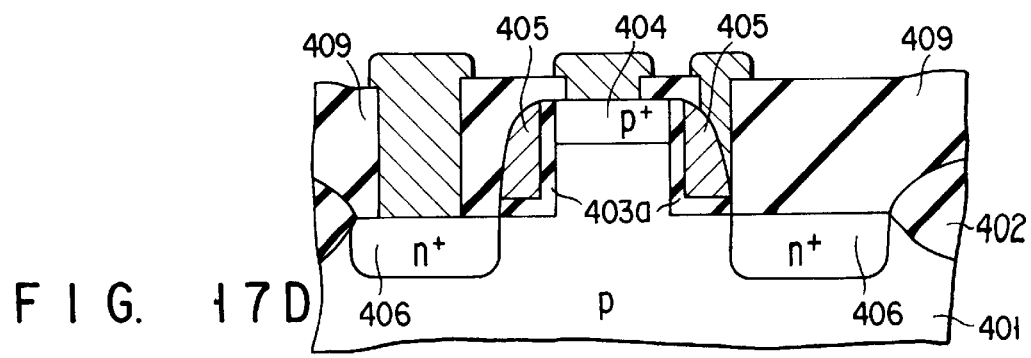

Next, as shown in FIG. 17C, n-type impurity is ion-implanted with high impurity concentration into the source forming region 406. After this, an insulating film such as an oxide film which is used as the inter-level insulating film 409 is formed on the silicon substrate 401 by the CVD method or the like and the heat treatment is effected to activate the implanted impurity ions. Then, openings are formed in the thus formed insulating film by the photolithography process and etching process and contacts 405a, 404a, 406a are formed in the openings by use of a metal material such as Al, and thus the surface tunnel effect element of the fourth embodiment is completed.

In the fourth embodiment, the convex portion is formed in the element region, but it is possible to form a concave portion, form impurity regions in the bottom and brink portions thereof, and form a gate electrode on the side wall portion of the concave portion.

(Fifth Embodiment)

Figure 18A:
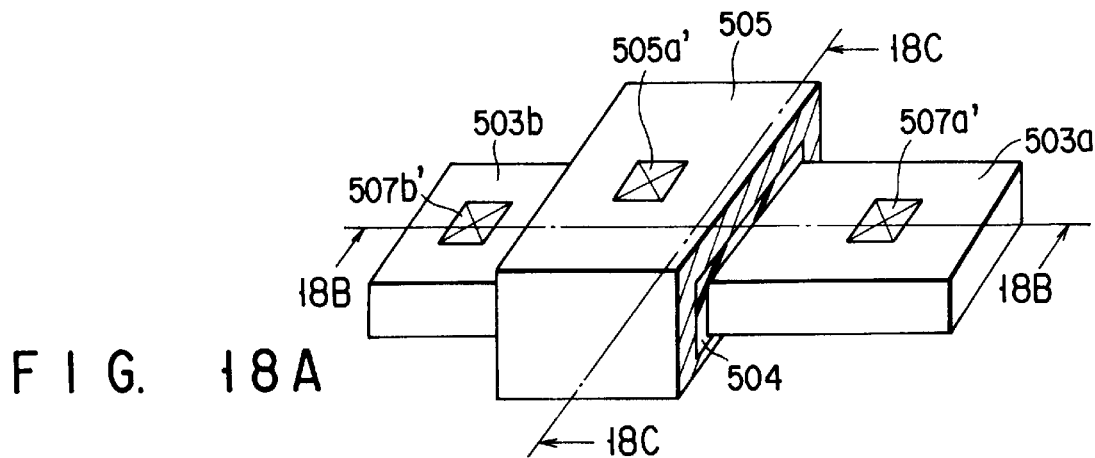
FIG. 18A is a perspective view showing a semiconductor device according to a fifth embodiment of this invention.
Figure 18B:
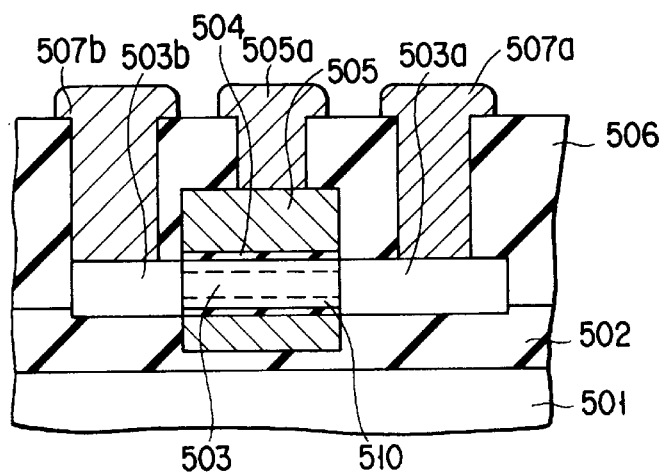
FIG. 18B is a cross sectional view taken along the line 18B—18B of FIG. 18A.
Figure 18C:
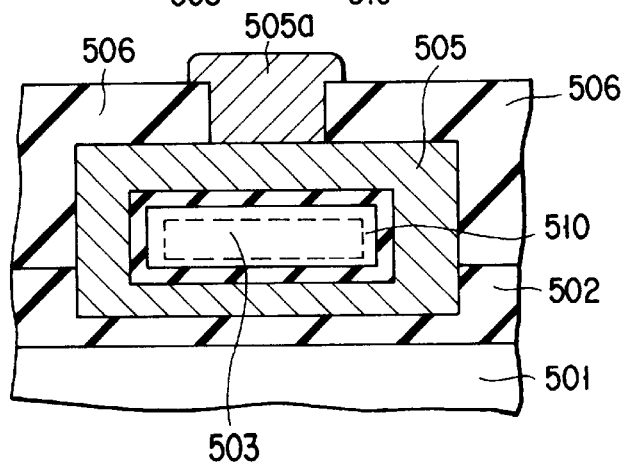
FIG. 18C is a cross sectional view taken along the line 18C—18C of FIG. 18A.

Next, a fifth embodiment of this invention is explained. FIG. 18A is a perspective view showing an element region in the fifth embodiment and an insulating film and inter-level insulating film are not shown in FIG. 18A. FIG. 18B is a cross sectional view taken along the line 18B—18B of FIG. 18A. FIG. 18C is a cross sectional view taken along the line 18C—18C of FIG. 18A. In FIGS. 18B and 18C, an insulating film 502 and an inter-level insulating film 506 are shown.

In the fifth embodiment, source and drain regions 503a, 503b, gate insulating film 504, and gate electrode 505 are formed by use of an SOI substrate. As shown in FIG. 18A, the gate insulating film 504 and gate electrode 505 are formed to surround the semiconductor layer (region interposed between 503a and 503b). The source and drain regions 503a, 503b are formed in portions of the semiconductor layer which lie on both sides of the gate electrode 505. The interface regions between the source and drain regions 503a, 503b and a channel region formed in a portion of the semiconductor layer between the source and drain regions are formed slightly inside the outer peripheries of the gate electrode 505 so that they can be covered with the gate electrode 505.

A source contact 507a, drain contact 507b and gate contact 505a are formed on the upper surfaces of the source and drain regions 503a, 503b and gate electrode 505. In FIG. 18A, reference numerals 507a', 507b' and 505a' indicate contact regions to which the contacts 507a, 507b and 505a are connected. Further, a reference numeral 501 indicates a semiconductor substrate such as a silicon substrate, 502 indicates an insulating film of the SOI substrate, 503 (503a, 503b and a layer interposed therebetween) indicates a semiconductor layer (silicon layer) of the SOI substrate.

In this embodiment, an inversion layer or storage layer is formed in the surface area of the silicon layer 503 which lies near the gate electrode 505 with the gate insulating film 504 disposed therebetween by applying a voltage to the gate electrode 505 and is used as the channel region 510. Further, since a tunnel diode formed in the interface between the channel region and the source/drain region is kept apart from the element isolation insulating film, the negative resistance characteristic can be attained without receiving any influence.

Figure 19A:
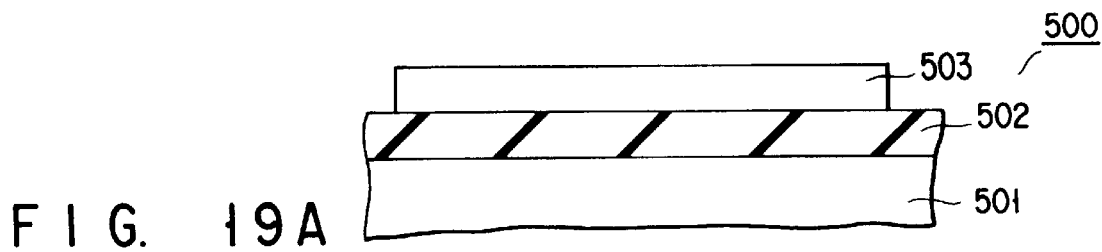
FIGS. 19A to 19D are cross sectional views sequentially showing the steps of a manufacturing process for manufacturing the semiconductor device of the fifth embodiment.

Next, one example of a method for manufacturing the device of the fifth embodiment is explained with reference to FIGS. 19A to 19D. First, as shown in FIG. 19A, an SOI substrate 500 is prepared by forming an insulating film 502 on the surface of a silicon substrate 501 and forming a silicon layer used as a silicon layer is subjected to the photolithography process and etching process such as RIE to form the parallelepiped silicon film 503 which is long in the lateral direction in the drawing.

Figure 19B:
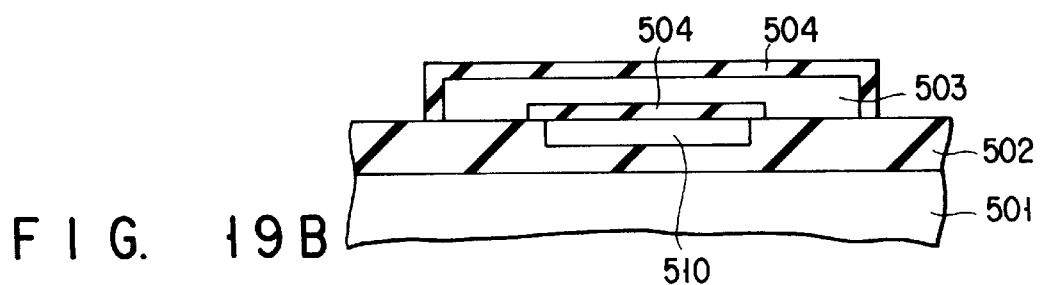

Next, a thermal oxide film (not shown) of approximately 200 nm thickness is formed on the surfaces of the upper portion and side portions of the parallelepiped silicon film 503. Then, a photoresist mask used for exposing the upper surface and side surfaces (which lie on the front and rear sides of the drawing and cannot be observed in the drawing) of the central portion of the silicon film 503 in FIG. 19A is formed on the entire surface of the substrate and a cavity 510 is formed in the insulating film 502 by etching out the oxide film on the surface of the silicon film 503 and the upper portion of the insulating film 502 of the SOI substrate lying under the silicon film 503 by the dilute hydrofluoric acid process. After this, as shown in FIG. 19B, a gate oxide film 504 is formed on the upper portion of the silicon film 503 the entire side surface thereof, and the bottom surface thereof exposed to the cavity 510 by the thermal oxidation process.

Figure 19C:
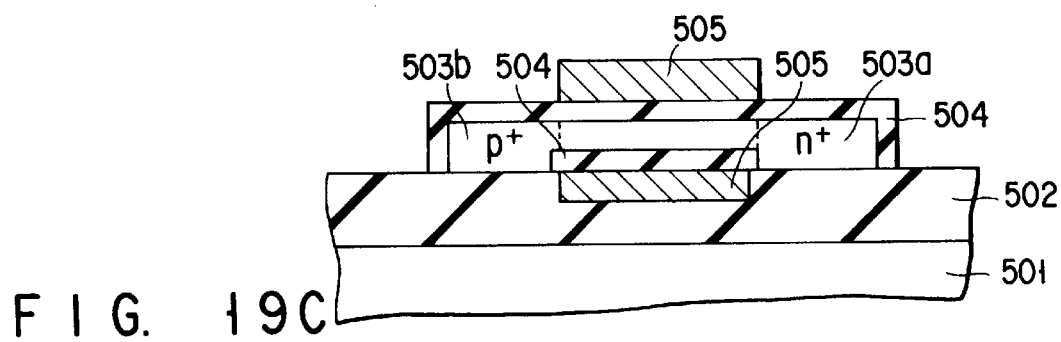
Figure 19D:
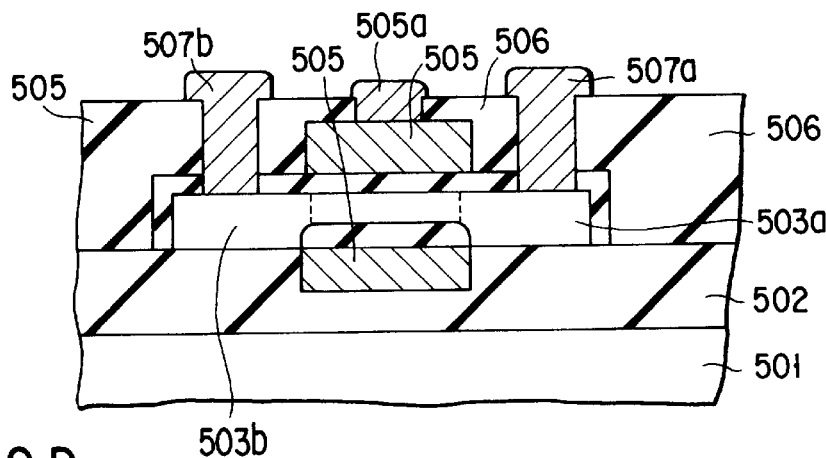

Next, a polysilicon film is formed by the LPCVD method or the like. At this time, as shown in FIG. 19C, the polysilicon film is deposited in the cavity 510 formed in the insulating film 502 and thus a gate electrode 505 which surrounds the central portion of the silicon film 503 with the insulating film 504 disposed therebetween is formed.

After this, a photoresist mask used for exposing the surface area of the source forming region 503a is formed on the entire surface of the substrate and then n-type impurity such as As, P is doped into the source forming region 503a with high impurity concentration by the ion-implanting technique or the like. Further, a photoresist mask used for exposing the drain forming region 503b is formed on the entire surface of the substrate and then p-type impurity such as $BF_2$ is doped into the drain forming region 503b with high impurity concentration.

Next, an insulating film is formed on the substrate 500 by the LPCVD to form an inter-level insulating film 506 and then the heat treatment is effected to activate the previously implanted impurities. By this activation, the end portions of the impurity regions 503a, 503b extend to under the gate insulating film 504 so that the gate electrode can sufficiently control the conduction between the impurity regions 503a and 503b.

After this, openings used for forming a source contact 507a, drain contact 507b and gate contact 505a are formed in the inter-level insulating film 506 by the photolithography process and etching process. Then, a metal film of Al or the like is formed on the substrate 500 by the sputtering method, for example. The metal film is subjected to the lithograpy process and etching process to form the source contact 507a, drain contact 507b and gate contact 505a and thus the surface tunnel effect element of the fifth embodiment is completed.

(Sixth Embodiment)

Next, the sixth embodiment of this invention is explained. In the sixth embodiment, two surface tunnel effect elements which are the same as the surface tunnel effect element in the second embodiment are serially connected. In the sixth embodiment, as shown in the plan view of FIG. 20A, a gate electrode 603 is formed around two drain regions 605a, 605c and two source regions 605b, 605d. The two drain regions 605a, 605c and two source regions 605b, 605d are formed separately from an element isolation region 602 on the surface area of a silicon substrate 601. Therefore, if an inversion layer or accumulation layer is formed in the surface area of the p-type silicon substrate 601 directly under the gate electrode by applying a voltage to the gate electrode, a tunnel diode is formed in the peripheral portion of the drain regions 605a, 605c or the source regions 605b, 605d.

Figure 20A:
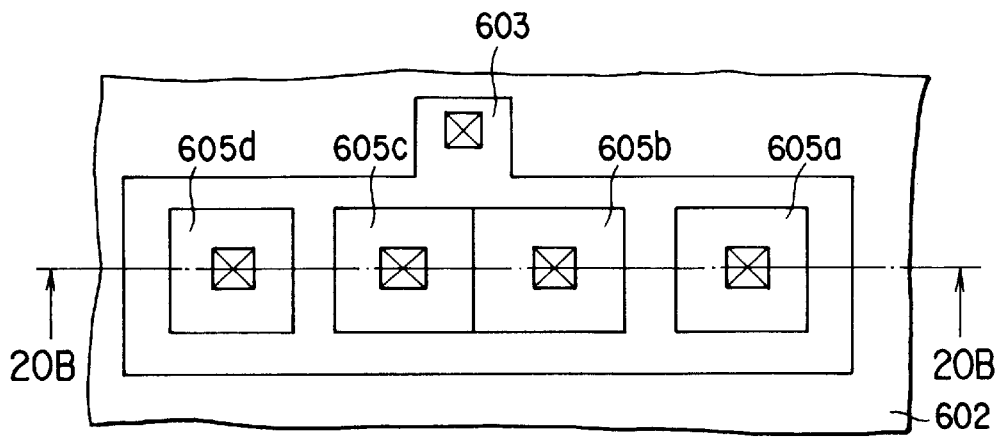
FIG. 20A is a plan view showing a semiconductor device according to a sixth embodiment of this invention.
Figure 20B:
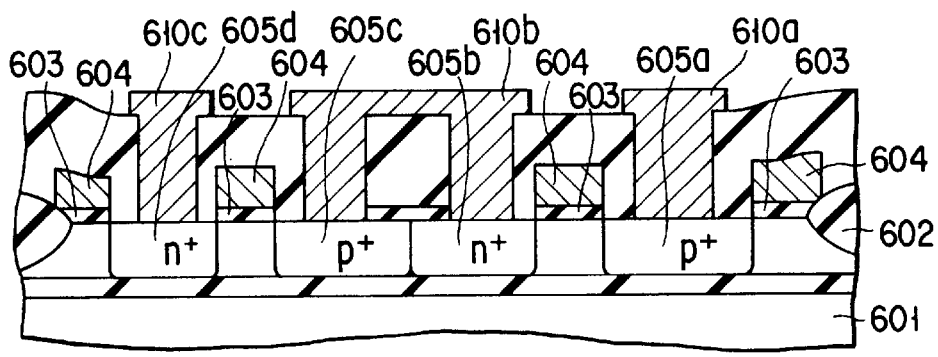
FIG. 20B is a cross sectional view taken along the line 20B—20B of FIG. 20A.

FIG. 20B is a cross sectional view taken along the line 20B—20B of FIG. 20A. The element isolation region 602 is formed on the surface of the silicon substrate 601 by the LOCOS method or the like. The source and drain regions 605a, 605b, 605c, 605d are formed in the surface area of the silicon substrate 601 in position separated from the element isolation region 602. Further, drain and source contacts 610a and 610c formed in the inter-level insulating film are formed on the drain and source regions 605a and 605d. A common source/drain contact 610b is formed on the source and drain regions 605b and 605c. A reference numeral 603 indicates a gate insulating film formed by the thermal oxidation process or the like.

Figure 21:
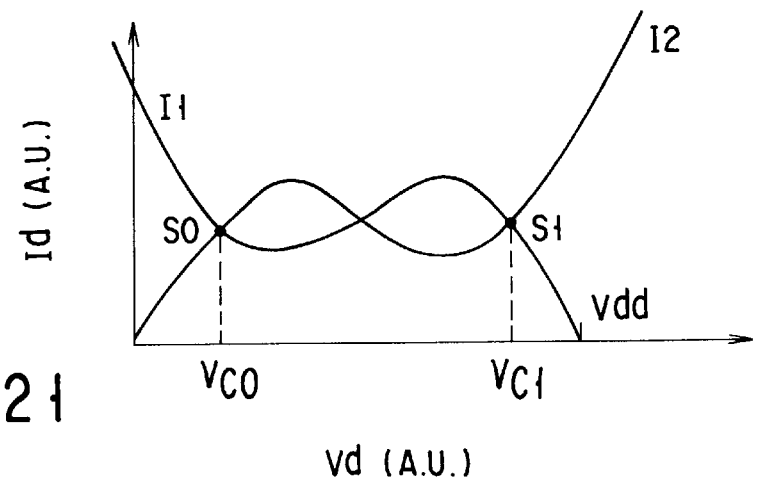
FIG. 21 is an Id-Vd characteristic diagram of the semiconductor device of the sixth embodiment.
Figure 22:
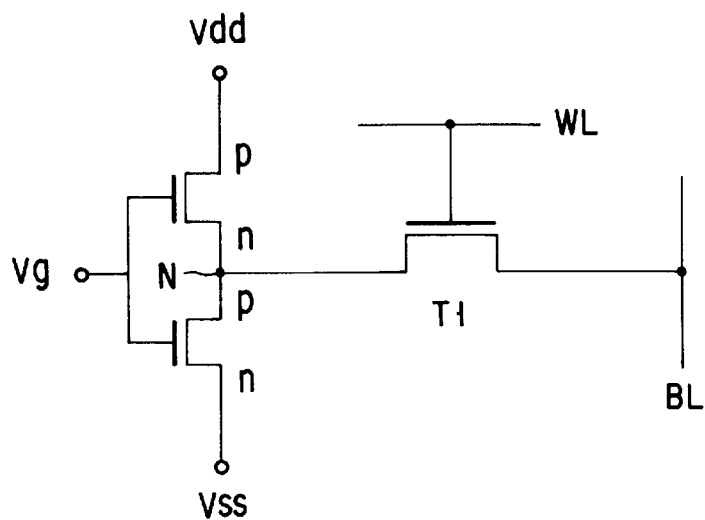
FIG. 22 is an equivalent circuit diagram for illustrating an example of application of the semiconductor device of the sixth embodiment to a memory cell.

In the sixth embodiment, an accumulation layer or an inversion layer is formed in the surface area of the substrate 601 directly under the gate electrode 604 by applying a voltage to the gate electrode 604 and a tunnel diode is formed in the interface region between the thus formed layer and the source or drain region. By applying a bias voltage between the drain contact 610a and the source contact 610c, two surface tunnel effect elements are operated. The Id-Vd characteristics of the elements are shown in FIG. 21. $I_1$ indicates a current flowing in the surface tunnel effect element having the drain region 605a as the constituent part thereof. $I_2$ indicates a current flowing in the other surface tunnel effect element. As shown in FIG. 21, there are points ($S_0$, $S_1$) at which the two currents become equal to each other and become stable. At this time, voltages $V_{C0}$ and $V_{C1}$ respectively become equal to the potentials of the contact 610b commonly connected to the two surface tunnel effect elements which are obtained at the respective stable points. For example, by setting $S_0$ and $S_1$ to respectively correspond to "0" and "1", an SRAM (Static Random Access Memory) cell can be obtained. FIG. 22 is a circuit diagram of the SRAM cell. A node N (the source/drain contact 610b shown in FIG. 20B) to which the source and drain of the two surface tunnel effect elements are connected is connected to one end of a transfer transistor $T_1$ and the potential ($V_{C0}$ or $V_{C1}$) of the node N is coupled to a bit line BL via the transfer transistor $T_1$. WL indicates a word line for applying a potential to the gate electrode of the transfer transistor $T_1$.

As described above, according to the first to sixth embodiments of this invention, a semiconductor device in which the electrical characteristic of the surface tunnel effect element with gate electrode surrounded by the element isolation region can be improved and which is suitable for integration can be obtained. Further, the amount of current can be increased in comparison with the conventional case.

Next, various application circuits obtained by using the surface tunnel effect element with gate electrode as a circuit element are explained. The perspective view showing the construction of the surface tunnel effect element used in the following embodiments and the definition of circuit symbols are respectively shown in FIGS. 23A and 23B. As the symbols of the surface tunnel effect element with gate electrode, symbols used in the normal MOS transistor are used for convenience in FIG. 22, but in the following embodiments, the symbols shown in FIG. 23B are used.

Figures 23A, 23B:
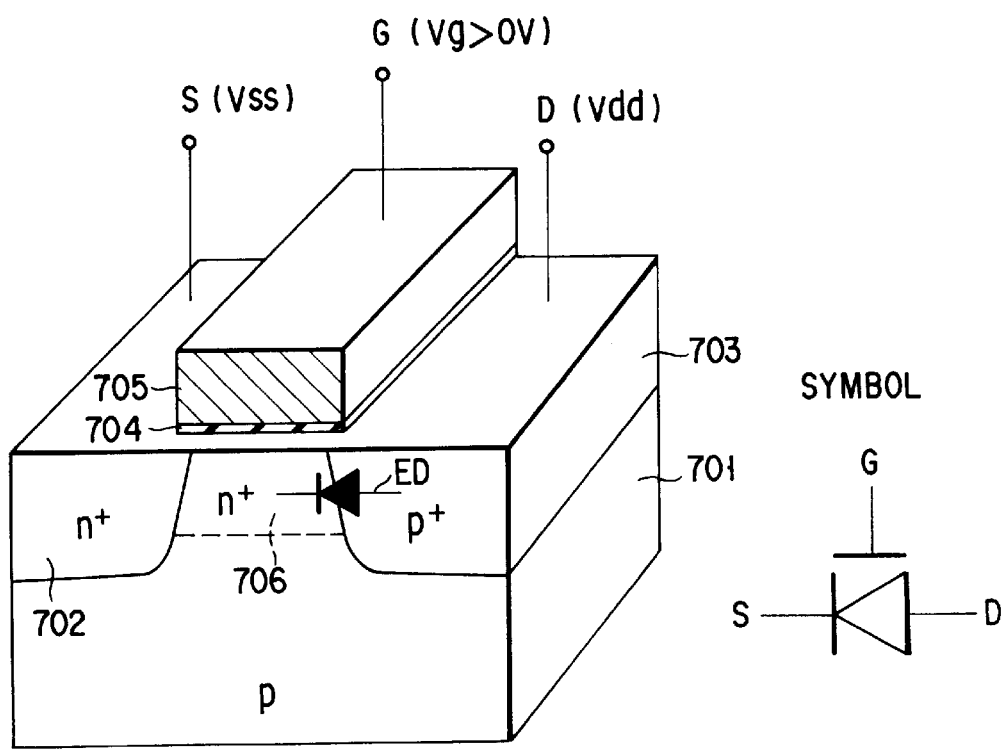
FIG. 23A is a perspective view of the cross section of a surface tunnel effect element with gate electrode used as a memory unit of an SRAM cell according to each of seventh to eighteenth embodiments.
FIG. 23B is a diagram for defining circuit symbols used in FIG. 23A.

In FIG. 23A, 701 indicates a p-type silicon substrate and an $n^+$-type source diffusion layer 702 and $p^+$-type drain diffusion layer 703 of high impurity concentration are selectively formed on the surface of the p-type silicon substrate 701.

Assume now that the $n^+$-type source diffusion layer 702 (S terminal) is connected to a voltage source Vss and the $p^+$-type drain diffusion layer 703 (D terminal) is connected to a voltage source Vdd. Further, in order to permit the current-voltage characteristic of the element to exhibit a negative differential resistance, for example, the impurity concentrations of the $n^+$-type source diffusion layer 702 and $p^+$-type drain diffusion layer 703 are set in the range of $10^{19}$ cm$^{-3}$ to $10^{22}$ cm$^{-3}$.

Then, a gate electrode 705 is formed on the surface of a portion of the substrate interposed between the $n^+$-type source diffusion layer 702 and $p^+$-type drain diffusion layer 703 with a gate insulating film 704 disposed therebetween.

In a case where the gate voltage Vg applied to the gate terminal G is 0V, a drain current, more specifically, a diffusion current will not flow if the drain voltage does not exceed a preset voltage. If the drain voltage exceeds the preset voltage, the current increases in proportion to the drain voltage.

In a case where the gate voltage Vg is a positive voltage, an $n^+$-type inversion layer 706 is formed in the substrate surface region below the gate electrode 705 and a tunnel (ESAKI) diode ED is formed in the interface between the $n^+$-type inversion layer 706 and $p^+$-type drain diffusion layer 703. As a result, the current-voltage characteristic of the tunnel effect element (ET) with gate electrode exhibits a negative differential resistance (refer to FIG. 7).

(Seventh Embodiment)

Figures 24, 25, 27:
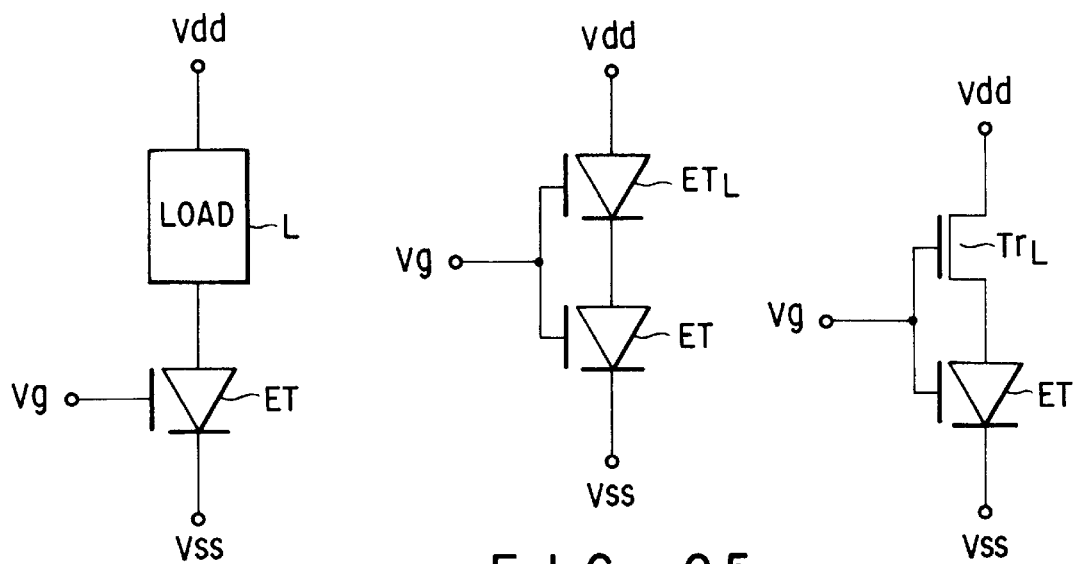
FIG. 24 is a diagram showing the equivalent circuit of the memory unit of the SRAM cell according to the seventh embodiment of this invention.
FIG. 25 is a diagram showing the equivalent circuit of the memory unit of the SRAM cell according to the eighth embodiment of this invention.
FIG. 27 is a diagram showing the equivalent circuit of the memory unit of the SRAM cell according to the ninth embodiment of this invention.

FIG. 24 is a diagram showing the equivalent circuit of a memory unit of an SRAM cell according to a seventh embodiment of this invention.

The memory unit is constructed by a surface tunnel effect element ET with gate electrode connected in a forward direction between a voltage source Vss (first voltage source) of low voltage level and a voltage source Vdd (second voltage source) of high voltage level, and a load L connected between the tunnel effect element ET and the voltage source Vdd and serially connected to the tunnel effect element ET. As the load L, for example, a tunnel effect element with gate electrode, an MOS transistor, a conventional tunnel diode or a resistance element can be used.

With the above construction, a system constructed by the tunnel effect element ET with gate electrode and the load L comes to have two stable states. Like the case of the conventional system constructed by two tunnel diodes, the two stable states can be used to attain a memory circuit.

Since the density of electrons in the $n^+$-type inversion layer 706 increases with an increase in the gate voltage Vg, the tunnel current becomes larger as the gate voltage Vg becomes higher if the gate voltage Vg is a positive voltage.

Therefore, a large driving current can be obtained by increasing the gate voltage Vg at the time of reading of a storage signal (accumulation charge). On the other hand, at the time of standby, the power consumption can be reduced by lowering the gate voltage Vg to reduce the driving current.

Figure 1:
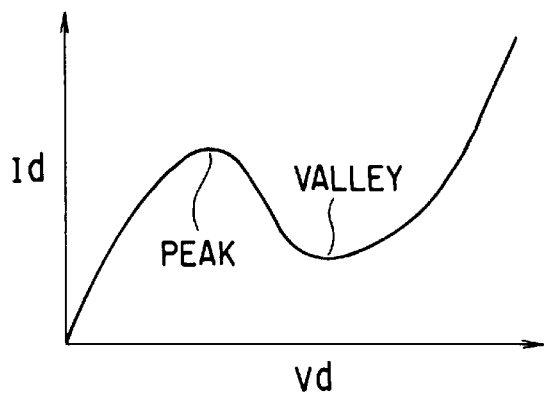
FIG. 1 is an Id-Vd characteristic diagram for illustrating the negative resistance characteristic of a general tunnel effect element.
Figure 2:
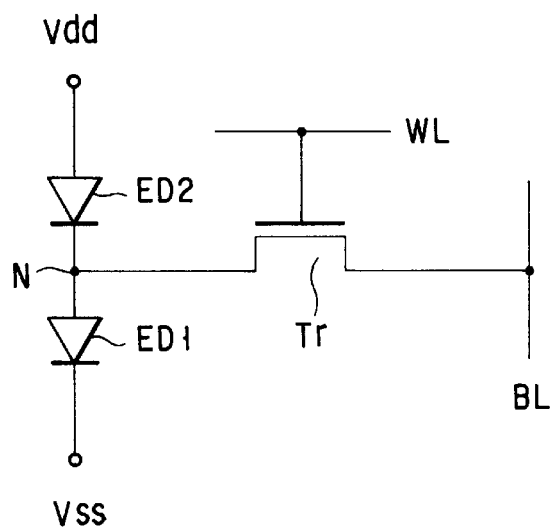
FIG. 2 is a diagram showing the equivalent circuit of an SRAM cell using a conventional tunnel diode.
Figure 3:
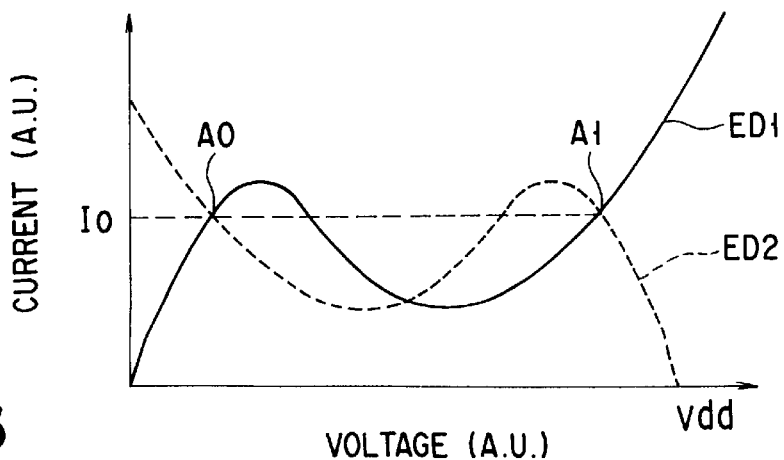
FIG. 3 is a characteristic diagram for illustrating the current-voltage characteristics of diodes ED1, ED2 in the SRAM cell of FIG. 2 as a memory unit and the functions thereof as a memory unit.

As described above, the memory unit of this embodiment is constructed by two elements: the tunnel effect element ET with gate electrode and the load L. Therefore, like the conventional memory unit constructed by the two tunnel diodes ED1, ED2 shown in FIG. 2, the memory unit of this embodiment is advantageous for high integration.

As described above, the memory unit of this embodiment is effective for high integration, low power consumption and high operation speed. Therefore, if an SRAM cell is constructed by use of the memory unit of this embodiment, an SRAM of high integration density, low power consumption and high operation speed can be attained.

(Eighth Embodiment)

FIG. 25 is a diagram showing the equivalent circuit of a memory unit of an SRAM cell according to an eighth embodiment of this invention. In the following drawings, portions which are the same as those of the seventh embodiment are denoted by the same reference numerals and the explanation thereof is omitted.

Figure 26:
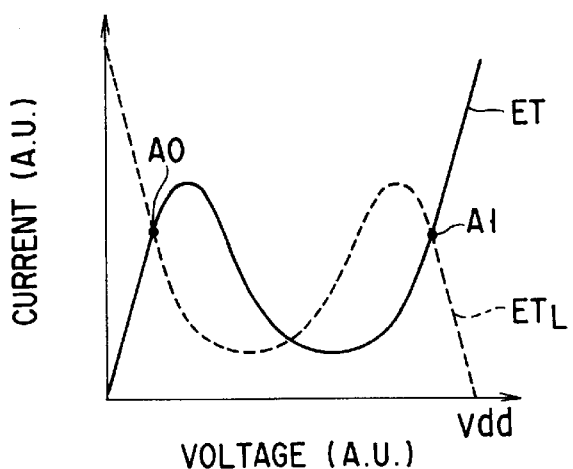
FIG. 26 is a characteristic diagram showing a current-voltage characteristic of a surface tunnel effect element with gate electrode in the memory unit of FIG. 25.

In the SRAM cell of this embodiment, the load used in the seventh embodiment is more specifically defined and a tunnel effect element ETL with gate electrode is used as the load L. A gate voltage Vg is applied to the gates of the tunnel effect elements ET, ETL with gate electrodes. The current-voltage characteristics of the tunnel effect elements ET, ETL with gate electrode in the memory unit with the above construction are shown in FIG. 26. The current-voltage characteristics are obtained when a positive voltage is applied to the gate electrode and is substantially the same as that obtained in the sixth embodiment (FIG. 21).

(Ninth Embodiment)

FIG. 27 is a diagram showing the equivalent circuit of a memory unit of an SRAM cell according to a ninth embodiment of this invention. The SRAM cell of this embodiment is obtained by more specifically defining the load used in the seventh embodiment and a MOS transistor TrL is used as the load L. A common gate voltage Vg is applied to the gates of the tunnel effect element ET with gate electrode and the MOS transistor TrL.

Figure 28:
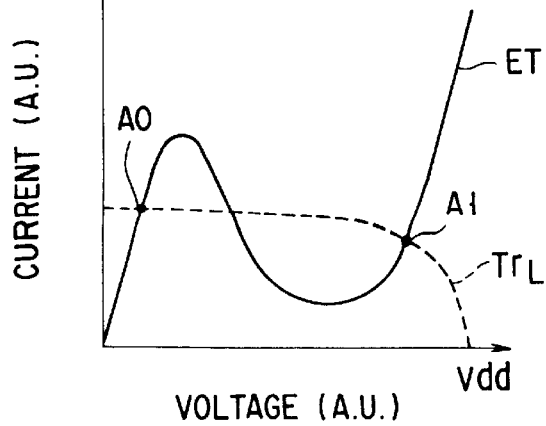
FIG. 28 is a characteristic diagram showing current-voltage characteristics of a surface tunnel effect element with gate electrode and a MOS transistor in the memory unit of FIG. 27.

The current-voltage characteristics of the tunnel effect element ET with gate electrode and the MOS transistor TrL in the memory unit with the above construction are shown in FIG. 28. In this case, a positive voltage is applied to the gate electrodes. Like the eighth embodiment, two stable operating points $A_0$, $A_1$ are obtained.

(Tenth Embodiment)

Figure 29:
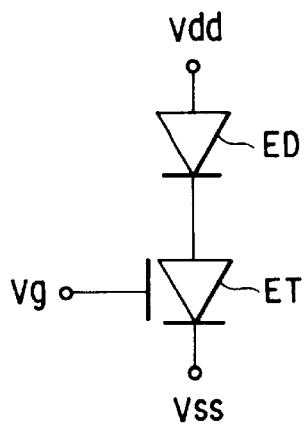
FIG. 29 is a diagram showing the equivalent circuit of the memory unit of the SRAM cell according to the tenth embodiment of this invention.

FIG. 29 is a diagram showing the equivalent circuit of a memory unit of an SRAM cell according to a tenth embodiment of this invention. The SRAM cell of this embodiment is obtained by more specifically defining the load used in the seventh embodiment and a conventional tunnel diode ED is used as the load L. The tunnel diode ED is connected in a forward direction.

Figure 30:
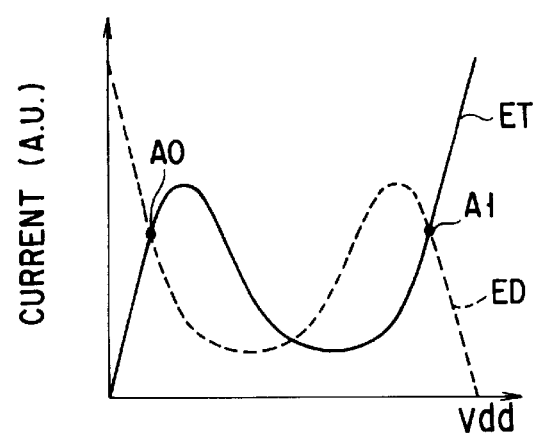
FIG. 30 is a characteristic diagram showing current-voltage characteristics of a surface tunnel effect element with gate electrode and a tunnel diode in the memory unit of FIG. 29.

The current-voltage characteristics of the tunnel effect element ET with gate electrode and the tunnel diode ED in the memory unit with the above construction are shown in FIG. 30. In this case, a positive voltage is applied to the gate electrode. Like the eighth embodiment, two stable operating points $A_0$, $A_1$ are obtained.

Further, a resonant tunnel effect element may be used in place of the tunnel diode ED. In this case, the same I-V characteristic (FIG. 30) as the tunnel diode ED is applied to the resonant tunnel effect element.

(Eleventh Embodiment)

Figure 31:
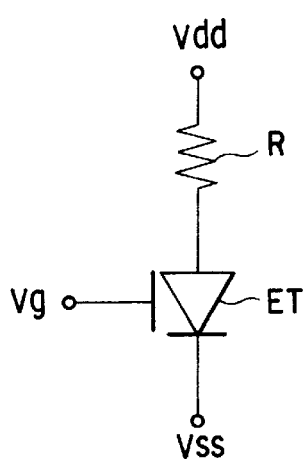
FIG. 31 is a diagram showing the equivalent circuit of the memory unit of the SRAM cell according to the eleventh embodiment of this invention.

FIG. 31 is a diagram showing the equivalent circuit of a memory unit of an SRAM cell according to an eleventh embodiment of this invention. The SRAM cell of this embodiment is obtained by more specifically defining the load used in the seventh embodiment and a resistance element R is used as the load L.

Figure 32:
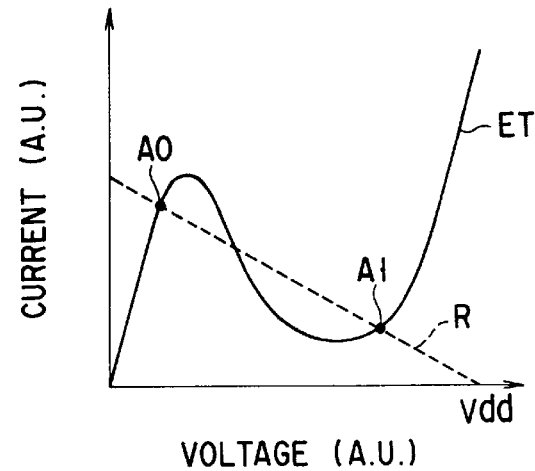
FIG. 32 is a characteristic diagram showing current-voltage characteristics of a surface tunnel effect element with gate electrode and a resistive element in the memory unit of FIG. 31.

The current-voltage characteristics of the tunnel effect element ET with gate electrode and the resistance element R in the memory unit with the above construction are shown in FIG. 32. In this case, a positive voltage is applied to the gate electrode. Like the eighth embodiment, the operating states become stable at two intersections $A_0$, $A_1$ between the two characteristic curves.

(Twelfth Embodiment)

Figure 33:
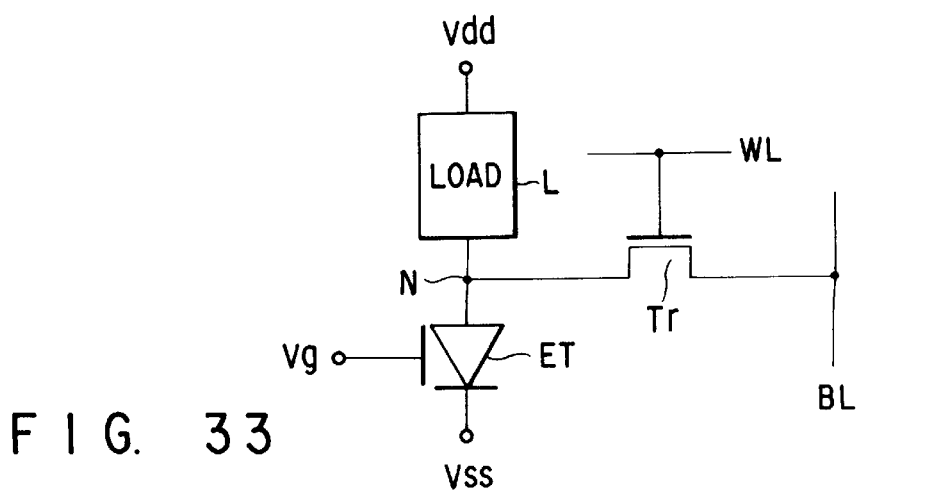
FIG. 33 is a diagram showing the equivalent circuit of the SRAM cell according to the twelfth embodiment of this invention.

FIG. 33 is a diagram showing the equivalent circuit of an SRAM cell according to a twelfth embodiment of this invention. The SRAM cell is constructed by the memory unit of FIG. 24 and a MOS transistor Tr. One of the drain and source of the MOS transistor Tr is connected to a connection node N of the tunnel effect element ET with gate electrode and the load L, the other one of the drain and source is connected to a bit line BL and the gate is connected to a word line WL.

The accumulation charge writing, readout and holding operations are controlled by the MOS transistor Tr. That is, in order to write the accumulation charge, the MOS transistor Tr is turned ON to electrically connect a selected bit line BL to the connection node N. As a result, charges as a storage signal corresponding to the product of a voltage of the bit line BL and the parasitic capacitance associated with the node N are rapidly accumulated in the connection node N and thus the storage signal can be written. The voltage of the bit line BL is selected so that the system constructed by the tunnel effect element ET with gate electrode and the load L will be set into the stable state.

In order to read out the accumulation charge, the MOS transistor Tr is turned ON while a positive voltage of high level is applied to the gate of the tunnel effect element ET with gate electrode so as to permit a maximum tunnel current to flow. As a result, the charge as a storage signal accumulated in the connection node N is rapidly read out via the bit line BL.

In order to hold the accumulation charge, the MOS transistor Tr is turned OFF while a voltage of low level is applied to the gate of the tunnel effect element ET with gate electrode so as to suppress the tunnel current to minimum. As a result, the charge as a storage signal accumulated in the connection node N can be held with a low power consumption.

(Thirteenth Embodiment)

Figure 34:
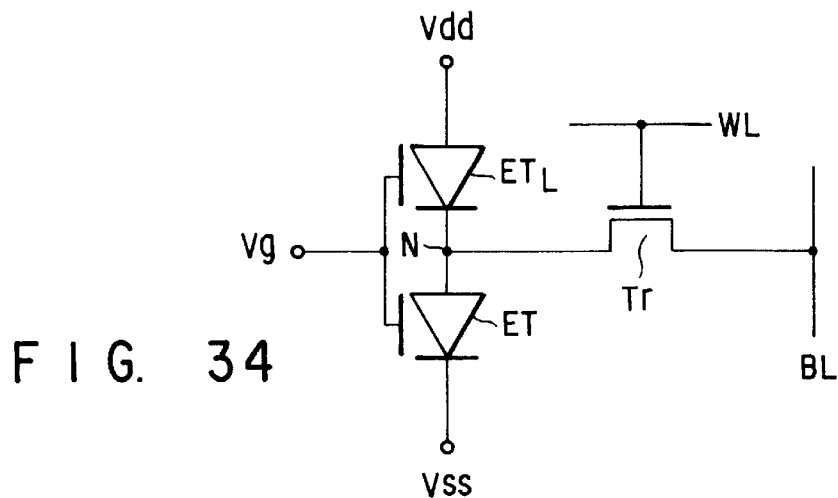
FIG. 34 is a diagram showing the equivalent circuit of the SRAM cell according to the thirteenth embodiment of this invention.
Figure 35:
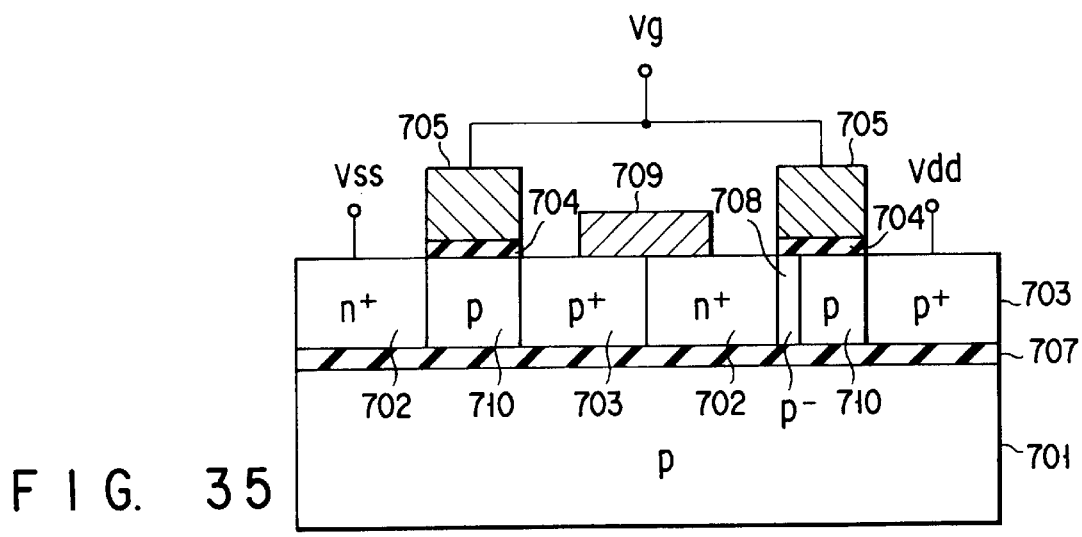
FIG. 35 is a cross sectional view of a memory unit portion used in the memory cell of FIG. 34.

FIG. 34 is a diagram showing the equivalent circuit of an SRAM cell according to a thirteenth embodiment of this invention. FIG. 35 is a cross sectional view of a memory unit of the SRAM cell.

The SRAM cell of this embodiment is obtained by more specifically defining the load used in the twelfth embodiment and the construction of FIG. 25 is used as the memory unit. This embodiment is substantially the same as the sixth embodiment, but the memory unit is formed on an SOI substrate and a buried oxide film 707 is made thin. The structure is so made as to increase the capacitance associated with the storage node (connection node N) and increase an amount of accumulation charges as a storage signal. With this structure, even if some leak current flows, the storage signal will not disappear.

Further, a $p^-$-type impurity diffusion layer 708 is formed in an inversion layer forming region 710 in order to increase the capacitance of the storage node. By formation of the $p^-$-type impurity diffusion layer 708, the width of the depletion layer in the pn junction is reduced and the capacitance of the storage node is increased. It is possible to increase the amount of accumulated charges by forming a capacitor in the same manner as in the case of DRAM cell in some cases. In FIG. 35, 709 indicates a wiring (electrode) for electrically connecting an $n^+$-type source diffusion layer 702 to a $p^+$-type drain diffusion layer 703.

Figure 36:
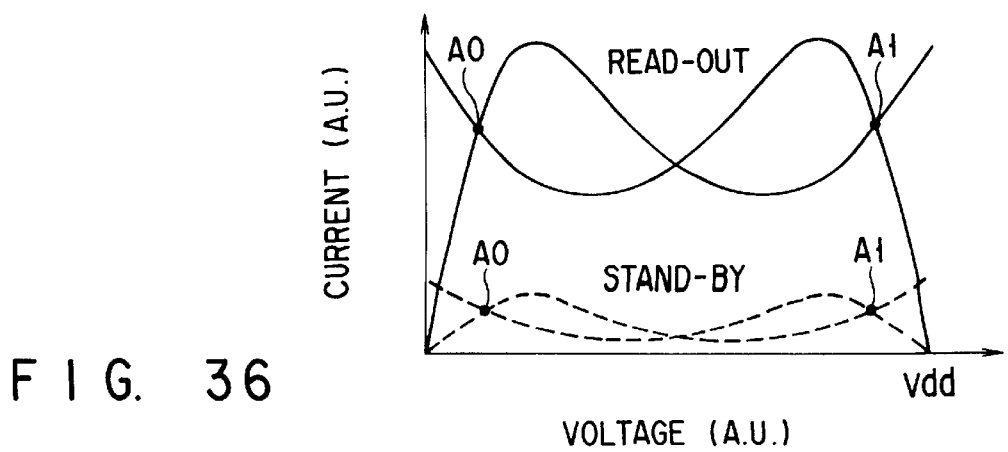
FIG. 36 is a characteristic diagram showing current-voltage characteristics of the SRAM cell of FIG. 34 at the time of standby and at the time of reading.

The current-voltage characteristics of the SRAM of this embodiment at the time of standby and readout are shown in FIG. 36. At the time of standby, since the gate voltage Vg can be sufficiently lowered, the tunnel current can be suppressed to minimum as shown in FIG. 36. As a result, the power consumption can be suppressed to an extremely small value.

At the time of readout, since the gate voltage Vg can be made sufficiently high, the tunnel current (driving current) can be increased to maximum as shown in FIG. 36. As a result, the delay time τpd can be suppressed to minimum and the readout speed becomes extremely high.

Further, the SRAM of this embodiment is constructed by three elements, that is, the tunnel effect elements ET, ETL with gate electrodes, and the MOS transistor Tr. Therefore, in this embodiment, the high integration of substantially the same degree as that of the conventional SRAM cell shown in FIG. 2 can be attained.

By using the SRAM cell of this embodiment, an SRAM of high integration density, low power consumption and high operation speed can be attained.

(Fourteen Embodiment)

Figure 37:
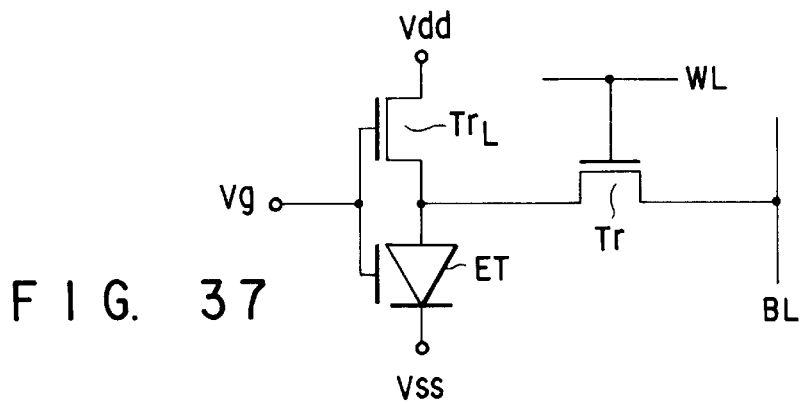
FIG. 37 is a diagram showing the equivalent circuit of the SRAM cell according to the fourteenth embodiment of this invention.

FIG. 37 is a diagram showing the equivalent circuit of an SRAM cell according to a fourteenth embodiment of this invention. The SRAM cell is obtained by more specifically defining the load used in the twelfth embodiment and the construction of FIG. 27 is used as the memory unit.

Figure 38:
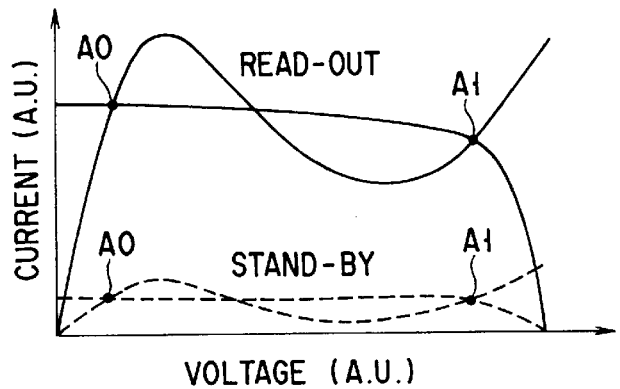
FIG. 38 is a characteristic diagram showing current-voltage characteristics of the SRAM cell of FIG. 37 at the time of standby and at the time of reading.

Also, in this embodiment, since the same current-voltage characteristics as those in the twelfth embodiment can be obtained at the time of standby and readout by controlling the gate voltage Vg as shown in FIG. 38, the low power consumption and high speed operation can be attained.

Further, the SRAM of this embodiment is constructed by three elements including the MOS transistor TrL, the tunnel effect element ET with gate electrode and the MOS transistor Tr. Therefore, in this embodiment, the high integration of substantially the same degree as that of the conventional case can be attained. By using the SRAM cell of this embodiment, an SRAM of high integration density, low power consumption and high operation speed can be attained.

In this embodiment, a common gate is used for the gate of the MOS transistor Tr and the gate of the tunnel effect element ET with gate electrode in order to simplify the circuit operation and this can be easily attained by optimizing the threshold voltage of the MOS transistor TrL, for example.

(Fifteenth Embodiment)

Figure 39:
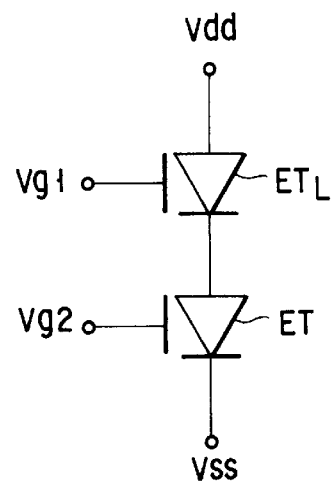
FIG. 39 is a diagram showing the equivalent circuit of the SRAM cell according to the fifteenth embodiment of this invention.

FIG. 39 is a diagram showing the equivalent circuit of an SRAM cell according to a fifteenth embodiment of this invention. The feature of the SRAM cell of this embodiment is that the gates of tunnel effect elements ETL, ET with gate electrodes connected in a forward direction are formed independently from each other. That is, the gate voltages Vg1, Vg2 of the tunnel effect elements ETL, ET with gate electrodes can be independently controlled by a gate voltage control circuit.

In this embodiment, the operation of reading out and holding (standby) a storage signal is the same as that in the former embodiments, but the operation of writing a storage signal is different from that in the former embodiments.

Figure 40:
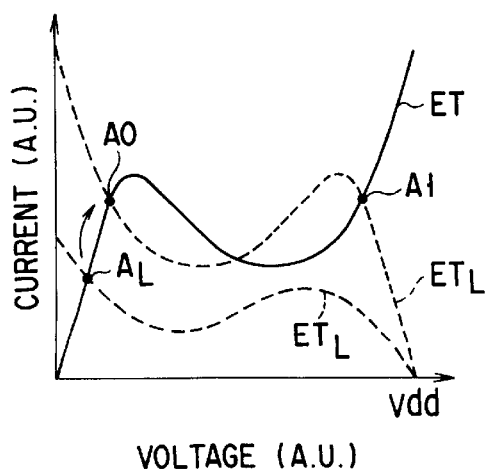
FIG. 40 is a current-voltage characteristic diagram for illustrating a method for writing a storage signal of low level into the SRAM cell of FIG. 39.

That is, when a storage signal of low level is written, first, the gate voltage Vg1 of the tunnel effect element ETL with gate electrode is set sufficiently lower than the gate voltage Vg2 while the gate voltage Vg2 of the tunnel effect element ET with gate electrode is fixed so that only one intersection AL between the characteristic curves of the elements ET and ETL, that is, only one stable state on the low voltage side can be obtained as shown in FIG. 40. Then, the gate voltage Vg1 is gradually increased to the gate voltage Vg2 and when two intersections A0. A1 between the characteristic curves of the elements ET and ETL are obtained as shown in FIG. 40, the system is automatically made stable on the low voltage side so as to write a storage signal of low level.

Figure 41:
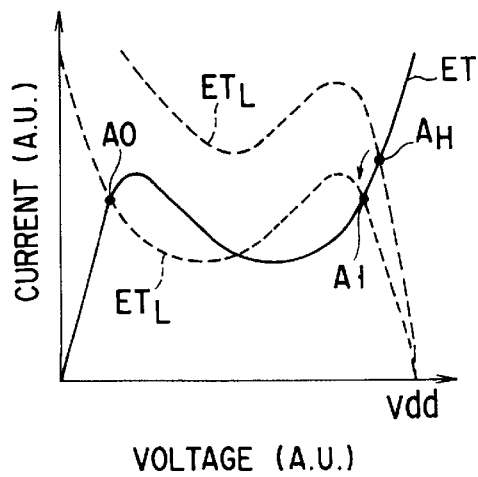
FIG. 41 is a current-voltage characteristic diagram for illustrating a method for writing a storage signal of high level into the SRAM cell of FIG. 39.

When a storage signal of high level is written, first, the gate voltage Vg1 of the tunnel effect element ETL with gate electrode is set sufficiently higher than the gate voltage Vg2 while the gate voltage Vg2 of the tunnel effect element ET with gate electrode is fixed so that only one intersection AH between the characteristic curves of the elements ET and ETL, that is, only one stable state on the high voltage side can be obtained as shown in FIG. 41. Then, the gate voltage Vg1 is gradually lowered to the gate voltage Vg2 and when two intersections A0. A1 between the characteristic curves of the elements ET and ETL are obtained as shown in FIG. 41, the system is automatically made stable on the high voltage side so as to write a storage signal of high level.

It is possible to treat the two stable states at the intersections AL and AH as storage signals of low and high levels, but in this case, it is necessary to generate two voltages corresponding to the storage signals of low and high levels by use of a voltage generating circuit.

Like the case of the SRAM cell of FIG. 34, it is possible to write the storage signal by use of the MOS transistor Tr, but in this case, it is necessary to generate two voltages by use of a voltage generating circuit.

Figure 42:
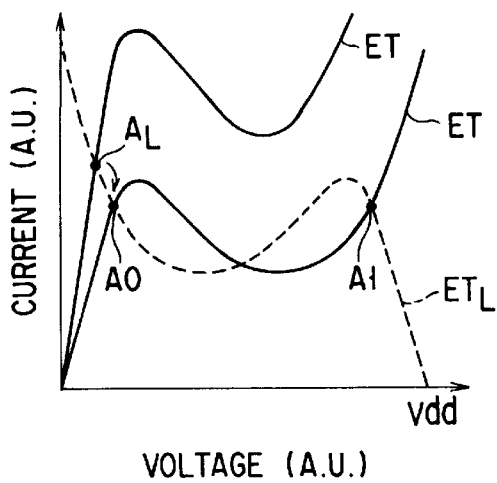
FIG. 42 is a current-voltage characteristic diagram for illustrating another method for writing a storage signal of low level into the SRAM cell of FIG. 39.
Figure 43:
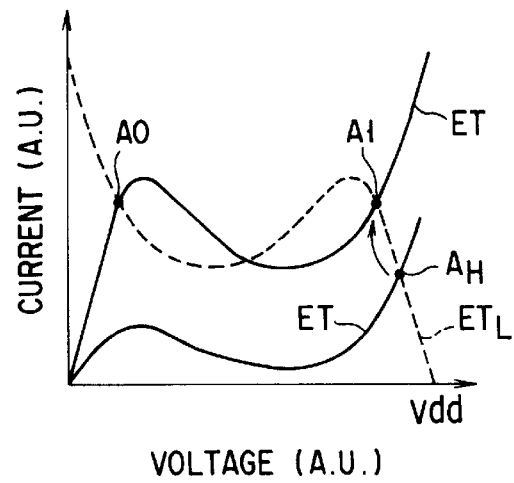
FIG. 43 is a current-voltage characteristic diagram for illustrating another method for writing a storage signal of high level into the SRAM cell of FIG. 39.

In this embodiment, the storage signal writing operation effected in a case where the gate voltage Vg2 is fixed is explained, but the storage signal writing operation can be effected in substantially the same manner in a case where the gate voltage Vg1 is fixed. The current-voltage characteristics corresponding to those of FIGS. 40 and 41 and obtained when the gate voltage Vg1 is fixed are shown in FIGS. 42 and 43.

In the SRAM using the conventional tunnel diode, no gate electrode is provided and the current-voltage characteristic cannot be changed according to the gate voltage, and therefore, it is impossible to effect the writing method as in this embodiment.

(Sixteenth Embodiment)

Figure 44:
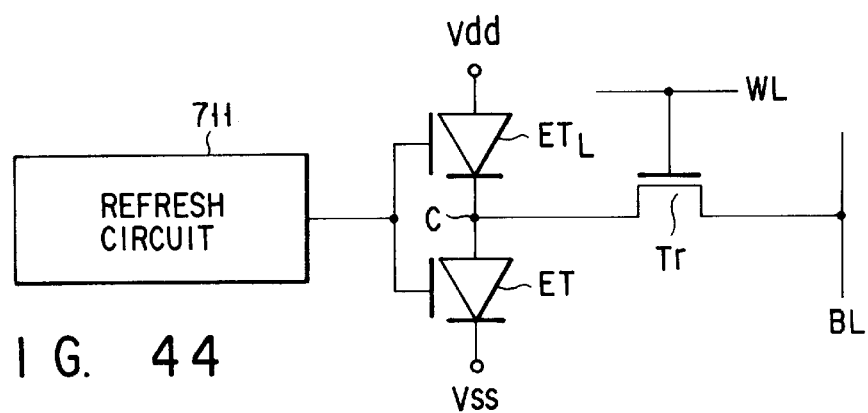
FIG. 44 is a diagram showing the equivalent circuit of the SRAM cell according to the sixteenth embodiment of this invention.

FIG. 44 is a diagram showing the equivalent circuit of an SRAM cell according to a sixteenth embodiment of this invention. The SRAM cell of this embodiment is obtained by additionally providing a refresh circuit 711 in the SRAM cell of the thirteenth embodiment shown in FIG. 34. At the time of standby, a so-called refresh operation for recovering the storage signal is effected by applying a pulse voltage to the gate in a preset cycle by means of the refresh circuit 711. With this construction, it is possible to prevent the charge as the storage signal accumulated in the connection node N from disappearing in the form of leak current so as to effectively prevent the storage signal from being destroyed. The construction can also be applied to the fourteenth embodiment shown in FIG. 37.

(Seventeenth Embodiment)

Figure 45:
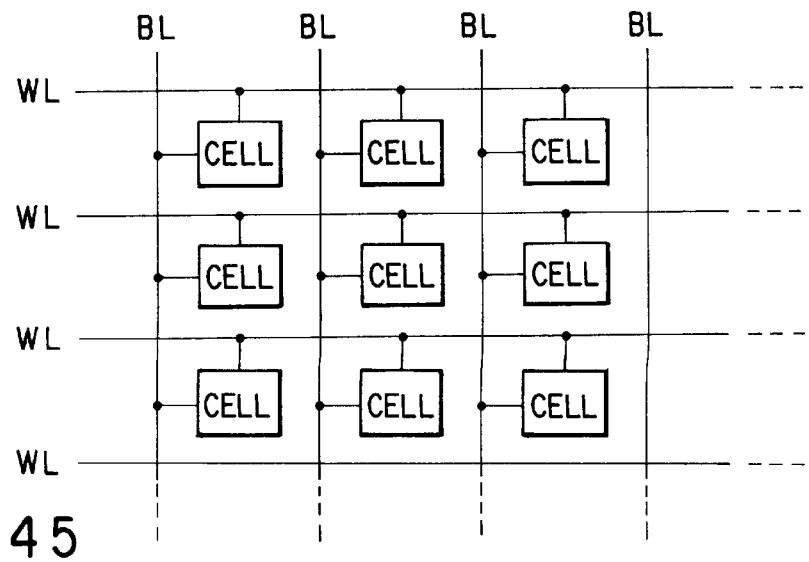
FIG. 45 is a diagram showing the construction of an SRAM cell array according to the seventeenth embodiment of this invention.

FIG. 45 shows one example of an SRAM cell array. SRAM cells are arranged in a matrix form, the SRAM cells disposed on the same row are connected to the same word line WL and the SRAM cells disposed on the same column are connected to the same bit line BL. As the memory unit, any one of the memory units of the eighth to eleventh embodiments can be used. The SRAM cell is excellent for high integration and the integration density of 1 Gbits or more can be attained.

Figure 46:
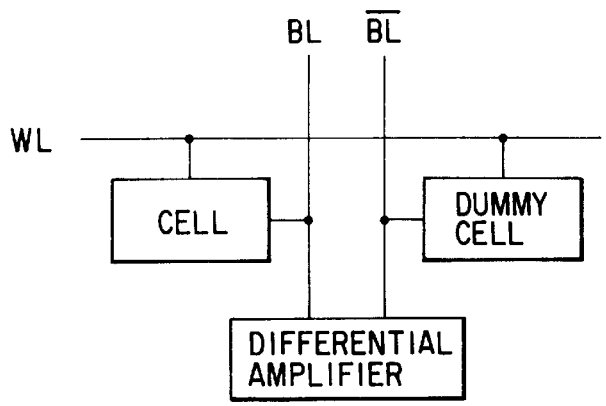
FIG. 46 is a diagram showing one example of a sense system in the seventeenth embodiment.

FIG. 46 shows one example of a sense system. In the sense system, the amplitude of a voltage (storage voltage) of a storage signal read out from an SRAM cell is compared with the amplitude of a voltage (reference voltage) of a reference signal read out from the dummy cell by use of a differential amplifier (sense circuit) and, for example, if the storage voltage is higher than the reference voltage, "1" is sensed, and if the storage voltage is lower than the reference voltage, "0" is sensed.

Figure 47:
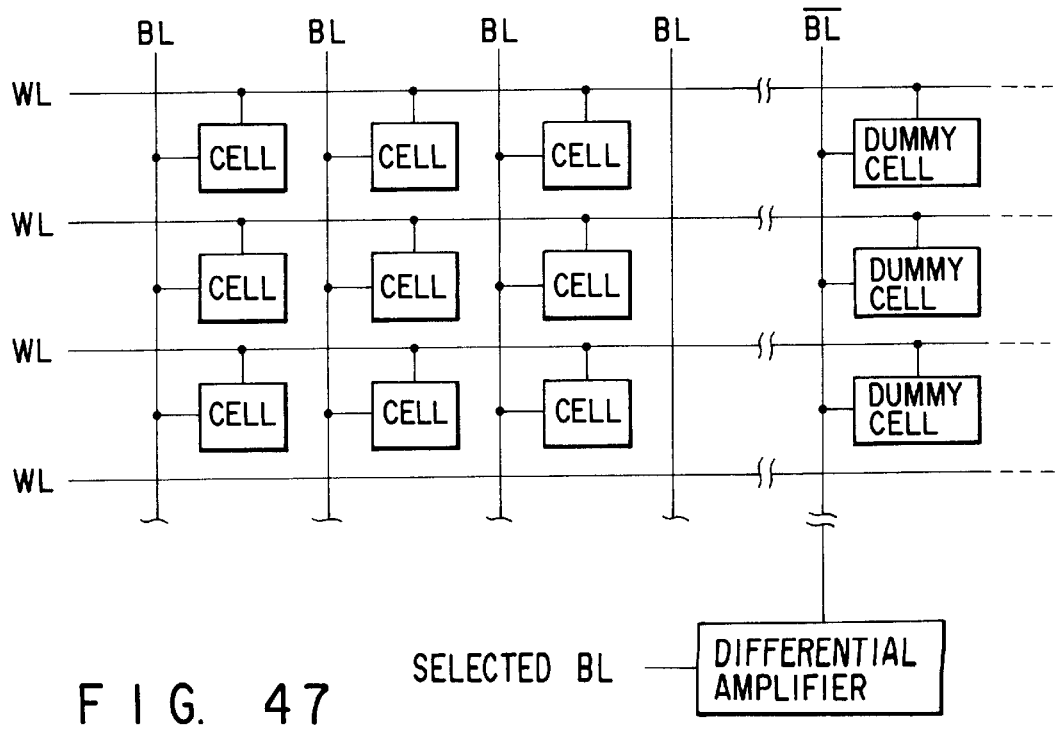
FIG. 47 is a diagram for illustrating an example in which the sense system of FIG. 46 is applied to the SRAM cell array of FIG. 45.

In a case where the sense system is applied to the SRAM cell array of FIG. 45, dummy cells are connected to the respective word lines WL as shown in FIG. 47, for example. In this case, the differential amplifier is commonly used. A column decoder and a row decoder are used to sequentially sense the SRAM cells.

(Eighteenth Embodiment)

Figure 48:
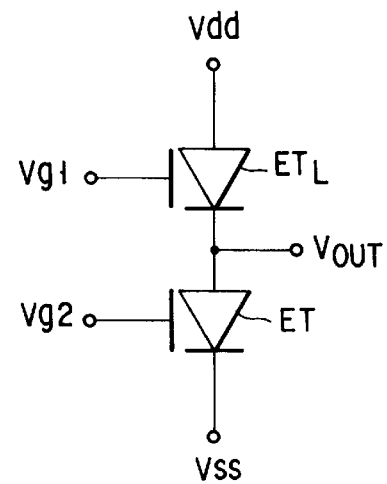
FIG. 48 is a diagram showing the equivalent circuit of the SRAM cell according to the eighteenth embodiment of this invention.

FIG. 48 is a diagram showing the equivalent circuit of an SRAM cell according to an eighteenth embodiment of this invention. In the embodiments described above, a binary memory is explained, but if the SRAM cell shown in FIG. 48 is used, for example, four different voltages can be obtained as the voltage Vout of the connection node N as shown in the following table 1 by controlling the gate voltages Vg1, Vg2 as described below. Therefore, by using the cell structure shown in FIG. 34 and the sense system shown in FIG. 47, a four-value memory can be attained.

TABLE 1

| Vg1 | off | on | on |
|---|---|---|---|
| Vg2 | on | off | on |
| Vout | Vss | Vdd | latch 1, 2 |

The gate voltages Vg1, Vg2 are controlled as follows.

The gate voltages Vg1, Vg2 are adjusted to set the tunnel effect element ETL with gate electrode into the OFF state and set the tunnel effect element ET with gate electrode into the ON state. In this case, the voltage Vout at the connection node N is set to a level equal to the second voltage source Vss.

Further, the gate voltages Vg1, Vg2 are adjusted to set the tunnel effect element ETL with gate electrode into the ON state and set the tunnel effect element ET with gate electrode into the OFF state. In this case, the voltage Vout at the connection node N is set to a level equal to the first voltage source Vdd.

Further, the gate voltages Vg1, Vg2 are adjusted to set the tunnel effect element ETL with gate electrode into the ON state and set the tunnel effect element ET with gate electrode into the ON state. In this case, like the embodiments described before, since two stable states (latch1, latch2) are provided, two different voltages can be obtained as the voltage Vout of the connection node N. The voltages are set to voltage levels between the voltage source Vss and the voltage source Vdd.

Thus, a total of four different voltages can be obtained as the voltage of the connection node N by controlling the gate voltages Vg1, Vg2 and a four-value memory can be attained.

As described above, according to the second aspect (seventh to eighteenth embodiments) of this invention, the high integration density, low power consumption and high-speed operation of the memory cell can be simultaneously attained by using the memory unit constructed by the tunnel effect element with gate electrode and the load.

The tunnel effect element with gate electrode of this invention can be variously applied in addition to the above cases. Some of the examples of the application are explained below.

(Nineteenth Embodiment)

Figure 49A:
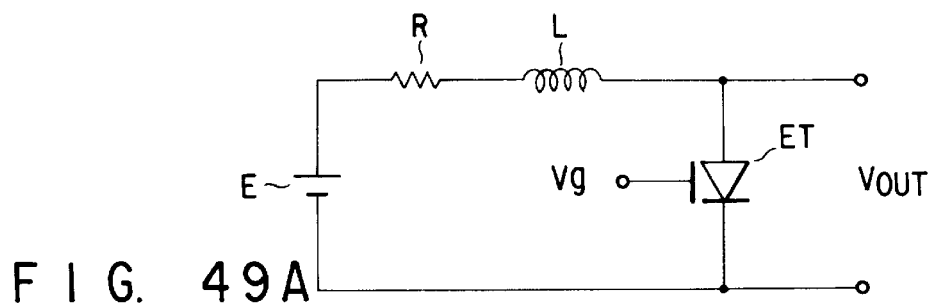
FIG. 49A is a diagram showing the equivalent circuit of a high-frequency oscillator according to a nineteenth embodiment of this invention.
Figure 49B:
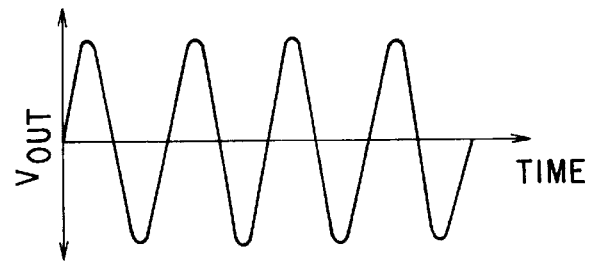
FIG. 49B is an output waveform diagram of the circuit of FIG. 49A.

FIG. 49A is a circuit diagram of a high frequency oscillation circuit according to a nineteenth embodiment of this invention. The oscillation circuit utilizes the negative resistance characteristic of the tunnel effect element with gate electrode. A series circuit of a resistor R, inductor L and tunnel effect element ET with gate electrode is serially connected to a DC power source E so as to form a closed circuit and an AC output as shown in FIG. 49B is derived from both ends of the tunnel effect element ET.

Conventionally, an oscillation circuit using a conventional tunnel diode and similar to the above oscillation circuit is known but it has a problem that the oscillation frequency thereof fluctuates because of a variation in the characteristic of the tunnel diode.

In the oscillation circuit of this invention, since the tunnel effect element with gate electrode is used, the characteristic of the tunnel effect element can be changed by adjusting the gate voltage Vg applied to the gate electrode thereof as explained with reference to FIG. 7. Therefore, a high frequency oscillator whose oscillation frequency can be tuned can be attained.

(Twentieth Embodiment)

Figure 50A:
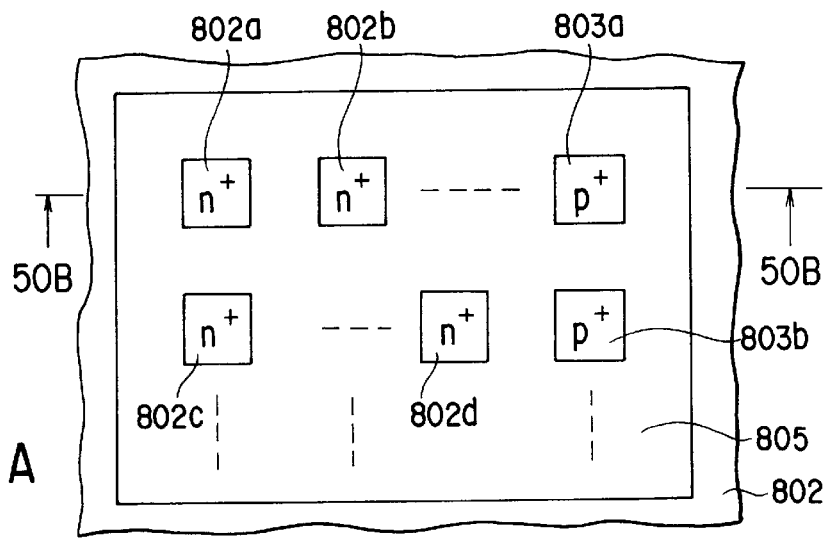
FIG. 50A is a plan view of a semiconductor device according to a twentieth embodiment of this invention.
Figure 50B:
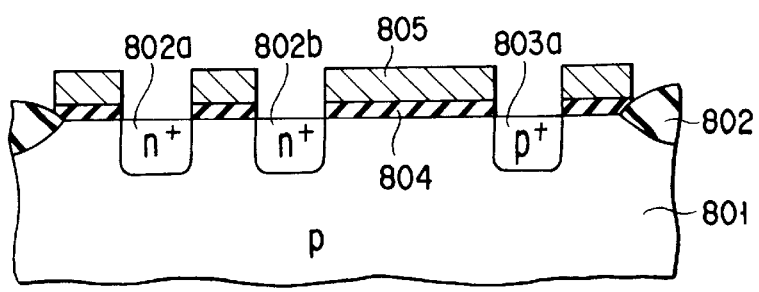
FIG. 50B is a cross sectional view taken along the line 50B—50B of FIG. 50A.

FIG. 50A is a plan view of a semiconductor device according to a twentieth embodiment of this invention and FIG. 50B is a cross sectional view taken along the line 50B—50B of FIG. 50A.

In the semiconductor device of this embodiment, a plurality of openings are formed in one gate electrode 805 which is formed above a p-type substrate 801 with a gate insulating film 804 disposed therebetween and a plurality of $n^+$-type diffusion regions 802a, 802b, 802c, 802d, - - - and a plurality of $p^+$-type diffusion regions 803a, 803b, - - - are formed on portions of the substrate 801 which lie in the openings.

By selectively combining the plurality of $n^+$-type diffusion regions and the plurality of $p^+$-type diffusion regions, a plurality of elements can be formed under one gate electrode. For example, by forming electrodes on the $p^+$-type diffusion regions 803a and 803b, the substrate resistor between the electrodes can be used as a resistance element. Further, by forming electrodes on the $n^+$-type diffusion regions 802a and 802b, an n-type MOSFET using the electrodes as source and drain electrodes and having the common gate electrode as a gate electrode can be formed. By forming electrodes on the $n^+$-type diffusion region 802d and the $p^+$-type diffusion region 803b, a surface tunnel effect element with gate electrode using the electrodes as source and drain electrodes can be formed.

With the structure of this embodiment, the gate electrode can be commonly used and the element occupying area can be reduced. Further, by changing the electrode wiring, the semiconductor device can be made to have different functions and a programmable element can be attained. Since the process up to the wiring step can be uniformly effected, the manufacturing process can be simplified and the manufacturing cost can be lowered. Further, a CMOSFET can be formed by forming an n well.

Additional advantages and modifications will readily occur to those skilled in the art. Therefore, the invention in its broader aspects is not limited to the specific details, and representative embodiments shown and described herein. Accordingly, various modifications may be made without departing from the spirit or scope of the general inventive concept as defined by the appended claims and their equivalents.

I claim:

1. A semiconductor device comprising;
   a semiconductor substrate having an element region on a main surface thereof;
   an element isolation region formed to surround said element region on said main surface of said semiconductor substrate; and
   a gate electrode formed over said element region with a gate insulating film disposed therebetween;
   a first and a second impurity diffusion region formed on a surface of said element region along both sides of at least part of said gate electrode, wherein said device has an operation such that
   a first channel region is formed in said surface of said element region below said gate electrode between said first and said second impurity diffusion region when a first preset voltage is applied to said gate electrode,
   a first tunnel diode is formed in a first interface region between said first impurity diffusion region and said first channel region when said first preset voltage is applied to said gate electrode; and
   any portion of said first interface region in which said first tunnel diode is formed is located in position separated from said element isolation region.

2. A semiconductor device according to claim 1, wherein said gate electrode is formed to surround said first impurity region, any portion of said interface region between said first impurity diffusion region and said first channel region, in which said first tunnel diode is formed, is located in position separated from said element isolation region, and said interface region surrounds said first impurity diffusion region.

3. A semiconductor device according to claim 2, wherein said at least part of said gate electrode disposed between said first and said second impurity diffusion region is formed to substantially cross said element region.

4. A semiconductor device according to claim 2, wherein said second impurity diffusion region is formed to surround said gate electrode.

5. A semiconductor device according to claim 1, wherein said first impurity diffusion region is formed to surround said gate electrode, said gate electrode is formed to surround said second impurity diffusion region, and said interface region in which said first tunnel diode is formed is located in position separated from said element isolation region to surround said gate electrode.

6. A semiconductor device according to claim 1, wherein said semiconductor device has an operation such that a negative resistance characteristic appears in said interface region formed in position separated from said element isolation region when a preset potential difference is applied between said first and said second impurity diffusion region and said first preset voltage is applied to said gate electrode.

7. A semiconductor device according to claim 1, wherein said first and said second impurity diffusion region has a different conductivity type to each other.

8. A semiconductor device according to claim 1, wherein said first and said second impurity diffusion region has a same conductivity type.

9. A semiconductor device according to claim 1, wherein a convex portion made of semiconductor is formed on said element region integrally therewith, said first impurity diffusion region is formed on an upper surface portion of said convex potion, said gate electrode is insulatively formed over a side surface of said convex portion, and said second impurity diffusion region is formed on a region of said surface of said element region which surrounds said gate electrode.

10. A semiconductor device according to claim 1, wherein a convex portion made of semiconductor is formed on said element region integrally therewith, said second impurity diffusion region is formed on an upper surface portion of said convex portion, said gate electrode is insulatively formed over a side surface of said convex portion, and said first impurity diffusion region is formed on a region of said surface of said element region which surrounds said gate electrode.

11. A semiconductor device according to claim 1, wherein said semiconductor substrate has a base substrate, an insulating layer formed on said base substrate and a semiconductor layer formed on said insulating layer, said element isolation region and said first and said second impurity diffusion region is formed on a surface area of said semiconductor layer, and said gate electrode is insulatively formed over said semiconductor layer.

12. A semiconductor device according to claim 1, wherein an impurity concentration of said interface region in which said first tunnel diode is formed is set in a range of $10^{19}$ cm$^{-3}$ to $10^{22}$ cm$^{-3}$.

13. A semiconductor device according to claim 1, wherein said device has an operation such that a second channel region is formed in said surface of said element region which lies below said gate electrode between said first and said second impurity diffusion region when a second preset voltage is applied to said gate electrode, a second tunnel diode is formed in a second interface region between second impurity diffusion region and said second channel region when said second preset voltage is applied to said gate electrode; and said second interface region in which said second tunnel diode is formed is located in position separated from said element isolation region.

14. A semiconductor device according to claim 1, wherein said any portion of said first interface region, in which said first tunnel diode is formed, is located in position separated from said element isolation region, in order to suppress an increase of a leakage current of said first tunnel diode.

15. A semiconductor device according to claim 1, wherein said first channel region formed when said first preset voltage is applied to said gate electrode is an inversion region.

16. A semiconductor device according to claim 1, wherein an intrinsic semiconductor region is inserted between said first impurity region and said element isolation region at least at a portion adjacent to said gate electrode in which said first tunnel diode is formed.

17. A semiconductor device comprising:
    a semiconductor substrate having an element region on a main surface thereof;
    an element isolation region formed to surround said element region on said main surface of said semiconductor substrate;
    a gate electrode having a plurality of openings and formed over said element region with a gate insulating film disposed therebetween; and
    a plurality of impurity diffusion regions formed on those portions of said semiconductor substrate which are in said plurality of openings, each of said plurality of diffusion regions having an impurity concentration in a range of $10^9$ cm$^{-3}$ to $10^{22}$ cm$^{-3}$,
    wherein said device has an operation such that
    a channel region is formed in said main surface of said semiconductor substrate between at least one pair of adjacent impurity diffusion regions among said plurality of impurity diffusion regions when a preset voltage is applied to said gate electrode, a tunnel diode is formed in an interface region between one impurity diffusion region of said at least one pair of adjacent impurity diffusion regions and said channel region when said preset voltage is applied to said gate electrode, and any portion of said interface region in which said tunnel diode is formed is located in position separated from said element isolation region.

18. A semiconductor device according to claim 17, wherein said any portion of said first interface region, in which said first tunnel diode is formed, is located in position separated from said element isolation region, in order to suppress an increase of a leakage current of said tunnel diode.

19. A semiconductor device according to claim 17, wherein said device has further an operation such that a tunnel is formed between said channel region and one region of said at least one pair of adjacent impurity diffusion regions when said preset voltage is applied to said gate electrode and a preset potential difference is applied between said at least one pair of adjacent impurity diffusion regions.

20. A semiconductor device according to claim 19, wherein said plurality of impurity diffusion regions include another pair of adjacent impurity diffusion regions different from said at least one pair of adjacent impurity diffusion regions and said another pair of adjacent impurity diffusion regions has a conductivity type opposite to a conductivity type of said semiconductor substrate and construct a MOS transistor in cooperation with said gate electrode.

21. A semiconductor device according to claim 19, wherein said plurality of impurity diffusion regions include another pair of adjacent impurity diffusion regions different from said at least one pair of adjacent impurity diffusion regions and said another pair of adjacent impurity diffusion regions has the same conductivity type as that of said semiconductor substrate and permit a resistor to be formed between two regions of said another pair of adjacent impurity diffusion regions.

22. A semiconductor device according to claim 19, wherein said semiconductor device has an operation such that said at least one pair of adjacent impurity diffusion regions include two pairs of adjacent impurity diffusion regions, in each of which a tunnel diode having a PN junction is formed between said channel region and one of said adjacent impurity diffusion regions when a present voltage is applied to said gate electrode and said present potential difference is applied between two regions of said adjacent impurity diffusion regions, and said two pairs of adjacent impurity diffusion regions are connected to each other, in such a manner that one of said impurity diffusion regions included in one of said two pairs of adjacent impurity diffusion regions is connected to one of said impurity diffusion regions included in the other of said two pairs of adjacent impurity diffusion regions, so as to form serially connected tunnel diodes with a PNPN arrangement.

23. A semiconductor device comprising:
a semiconductor substrate having a major surface;
an inter-level insulating film formed on said main surface of said semiconductor substrate;
a rectangular parallelepiped semiconductor layer formed to extend on said inter-level insulating film;
a gate insulating film formed to surround a peripheral portion of a central portion of said rectangular parallelepiped semiconductor layer in a lengthwise direction;
a gate electrode formed to surround said peripheral portion of said central portion of said rectangular parallelepiped semiconductor layer in said lengthwise direction with said gate insulating film disposed therebetween and formed to enter part of said gate insulating film;
a first and a second impurity diffusion region formed on portions of said rectangular parallelepiped semiconductor layer which lie on both sides of said gate electrode and formed to extend into under said gate electrode; and
an element isolation region formed to surround said gate electrode and said first and said second impurity diffusion region,
wherein said device has an operation such that
a channel region is formed in a surface area of said rectangular parallelepiped semiconductor layer which lies under said gate electrode between said first and said second impurity diffusion region when a present voltage is applied to said gate electrode, and
a tunnel diode is formed in an interface region between said channel region and one of said first and said second impurity diffusion region under said gate electrode and a preset voltage is applied to said gate electrode and a preset potential difference is applied between said first and said second impurity diffusion region.

24. A semiconductor device according to claim 23, wherein an impurity concentration of said interface region in which said tunnel diode is formed is set in a range of $10^{19}$ cm$^{-3}$ to $10^{22}$ cm$^{-3}$.

25. A semiconductor device according to claim 23, wherein any portion of said interface region, in which said tunnel diode is formed, is located in position separated from said element isolation region, in order to suppress an increase of a leakage current of said tunnel diode.

26. A semiconductor device comprising:
a semiconductor substate;
a first surface tunnel effect element formed in an element region surrounded by an element isolation region on said semiconductor substrate, said first surface tunnel effect element including a source region connected to a first voltage source and selectively formed on a surface of said semiconductor substrate, a drain region of high impurity concentration selectively formed on said surface of said semiconductor substrate in position different from said source region, and a first gate electrode formed over a portion of said surface of said semiconductor substrate which lies between said source region and said drain region and insulated from said semiconductor substrate, said first surface tunnel effect element having an operation such that a channel region of high carrier density is formed in said portion of said surface of said substrate between said drain region and said source region when a preset voltage is applied to said first gate electrode, and a tunnel diode is formed in an interface region between said channel region and one of said drain region and said source region when said preset voltage is applied to said first gate electrode; and
a load connected at one end thereof to said drain region of said first surface tunnel effect element and connected at the other end to a second voltage source;
wherein said device has an operation such that said first tunnel effect element and said load constitute a memory unit, a gate voltage of low level is applied to said first gate electrode of said first surface tunnel effect element in a storage signal holding period, and a gate voltage of high level is applied to said first gate electrode of said first surface tunnel effect element at a time of storage signal reading, and wherein any portion of said interface region, in which said tunnel diode is formed, is located in position separated from said element isolation region, in order to suppress an increase of a leakage current of said tunnel diode.

27. A semiconductor device according to claim 26, wherein said load is one selected from a group consisting of a second surface tunnel effect element, a MOS transistor, a tunnel diode, a resonant tunnel effect element and a resistive element.

28. A semiconductor device according to claim 26, wherein said load is one of a second surface tunnel effect element and a MOS transistor, which has a second gate electrode, and a gate terminal to which said first gate electrode of said first surface tunnel effect element and said second gate electrode are connected is provided.

29. A semiconductor device according to claim 28, wherein a refresh circuit for outputting a preset pulse signal in a preset cycle is connected to said gate terminal.

30. A semiconductor device according to claim 26, wherein said load is one of a second surface tunnel effect element and a MOS transistor, which has a second gate electrode, and said semiconductor device has an operation such that a fixed gate voltage is applied to one of said first gate electrode of said first surface tunnel effect element and said second gate electrode, and a gate voltage which varies until a stable operation voltage thereof is obtained is applied to the other of said first gate electrode and said second gate electrode.

* * * * *